(12) United States Patent
Taguchi et al.

(10) Patent No.: US 7,795,140 B2
(45) Date of Patent: Sep. 14, 2010

(54) METHOD OF MANUFACTURING SUBSTRATE

(75) Inventors: Yuichi Taguchi, Nagano (JP); Akinori Shiraishi, Nagano (JP); Masahiro Sunohara, Nagano (JP); Kei Murayama, Nagano (JP); Hideaki Sakaguchi, Nagano (JP); Mitsutoshi Higashi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 12/247,496

(22) Filed: Oct. 8, 2008

(65) Prior Publication Data

US 2009/0093117 A1    Apr. 9, 2009

(30) Foreign Application Priority Data

Oct. 9, 2007 (JP) .............................. 2007-263224

(51) Int. Cl.
*H01L 21/44* (2006.01)
(52) U.S. Cl. ................. 438/667; 257/E29.111
(58) Field of Classification Search .................. 438/667; 257/E21.476
See application file for complete search history.

(56) References Cited

U.S. PATENT DOCUMENTS

| 2005/0250423 A1* | 11/2005 | Nakamura et al. ............ 451/41 |
| 2006/0180858 A1* | 8/2006 | Loechelt et al. .............. 257/341 |
| 2008/0048337 A1* | 2/2008 | Takahashi et al. ........... 257/774 |

FOREIGN PATENT DOCUMENTS

JP    2005-175369    6/2005

* cited by examiner

*Primary Examiner*—Ha Tran T Nguyen
*Assistant Examiner*—Valerie Brown
(74) *Attorney, Agent, or Firm*—Rankin, Hill & Clark LLP

(57) ABSTRACT

A method of manufacturing a substrate, includes: (a) forming the through hole by etching the silicon substrate from a first surface of the silicon substrate by a Bosch process; (b) forming a thermal oxide film such that the thermal oxide film covers the first surface of the silicon substrate, a second surface of the silicon substrate opposite to the first surface, and a surface of the silicon substrate corresponding to a side surface of the through hole, by thermally oxidizing the silicon substrate where the through hole is formed; (c) removing the thermal oxide film; (d) forming an insulating film such that the insulating film covers the first and second surfaces of the silicon substrate and the surface of the silicon substrate corresponding to the side surface of the through hole; and (e) forming the through electrode in the through hole on which the insulating film is formed.

12 Claims, 40 Drawing Sheets

METHOD OF MANUFACTURING SUBSTRATE

This application is based on and claims priority from Japanese Patent Application No. 2007-263224, filed on Oct. 9, 2007, the entire contents of which are hereby incorporated by reference.

BACKGROUND

1. Technical Field

The present disclosure relates to a method of manufacturing a substrate that includes a through hole formed in a silicon substrate and a through electrode formed in the through hole and being insulated form the silicon substrate.

2. Related Art

In the past, a substrate (see FIG. 1), which includes a through hole formed in a silicon substrate and a through electrode formed in the through hole and being insulated form the silicon substrate, has been used as a substrate (interposer) that electrically connects a semiconductor device with a mounting substrate such as a mother board.

FIG. 1 is a cross-sectional view of a substrate in the related art.

Referring to FIG. 1, a related-art substrate 200 includes a silicon substrate 211, an insulating film 212, a through electrode 213, and wiring 214. The silicon substrate 211 has a plate shape, and includes a through hole 216. The through hole 216 is formed so as to pass through the silicon substrate 211 by a Bosch process. The Bosch process is a deep etching technique for silicon, specifically, an etching method of repeatedly performing etching (etching step) and etched sidewall protection (protecting step). Isotropic etching is performed using sulfur hexafluoride ($SF_6$) in the etching step, and a sidewall is protected (etching performed in a transverse direction is controlled) using Teflon (registered trademark) gas (for example, $C_4F_8$) in the protecting step. Since the etching step and the protecting step are repeatedly performed in the Bosch process, the side surface of the through hole 216 formed by the Bosch process has a scalloping shape (where fine unevenness is repeatedly formed). The thickness of the silicon substrate 211 may be, for example, 200 μm.

The insulating film 212 is formed to cover both surfaces 211A and 211B of the silicon substrate 211 and the surface of a portion of the silicon substrate corresponding to the side surface of the through hole 216. The insulating film 212 is a film that insulates the silicon substrate 211 from the through electrode 213 and the wiring 214. For example, an oxide film may be used as the insulating film 212.

The through electrode 213 is formed in the through hole 216 on which the insulating film 212 is formed. The upper end of the through electrode 213 is a portion on which a semiconductor device 201 is mounted, and the lower end of the through electrode 213 is connected to the wiring 214.

The wiring 214 is formed on the lower surface of the insulating film 212, which is formed on the lower surface 211B of the silicon substrate 211. The wiring 214 is connected to the lower end of the through electrode 213. The wiring 214 includes a pad portion 218 on which an external connection terminal 203 is provided. The pad portion 218 is electrically connected to a pad 205, which is provided on a mounting substrate 202 such as a mother board, through the external connection terminal 203.

FIGS. 2 to 7 are views illustrating steps of manufacturing the substrate in the related art. In FIGS. 2 to 7, the same components as those of the substrate 200 in the related art are represented by the same reference numerals.

A method of manufacturing the substrate 200 in the related art will be described with reference to FIGS. 2 to 7. Firstly, in a step illustrated in FIG. 2, a protective tape 221 is attached to the lower surface 211B of the silicon substrate 211 and a resist film 222 having an opening 222A is then formed on the upper surface 211A of the silicon substrate 211. The protective tape 221 is a tape for preventing a stage of an etching apparatus (not shown) from being etched when the silicon substrate 211 is etched by the Bosch process. The opening 222A is formed so that the portion of the upper surface 211A of the silicon substrate 211 corresponding to a forming region of the through hole 216 is exposed to the outside. Meanwhile, the thickness of the silicon substrate 211 in this step is larger than that of the silicon substrate 211 shown in FIG. 1. Specifically, the thickness of the silicon substrate 211 shown in FIG. 2 may be, for example, 250 μm.

In a step illustrated in FIG. 3, the silicon substrate 211 is etched by the Bosch process that uses the resist film 222 as a mask, thereby forming the through hole 216. The depth of the through hole 216 in this step is larger than that of the through hole 216 shown in FIG. 1. Further, notches F may be formed at the end of the through hole 216 as shown in FIG. 3. A case where the notches F are formed will be described below as an example.

Subsequently, in a step illustrated in FIG. 4, the protective tape 221 and the resist film 222 shown in FIG. 3 are removed and a back-grinding tape 224 is then attached to the upper surface 211A of the silicon substrate 211.

Then, in a step illustrated in FIG. 5, the silicon substrate 211 is ground from the lower surface 211B of the silicon substrate 211 and the silicon substrate 211 is then polished from the lower surface 211B of the silicon substrate 211, so that the notches F formed at the lower end of the through hole 216 are removed. If the thickness of the silicon substrate 211 is 250 μm before the grinding, the thickness of the silicon substrate 211 may be, for example, 200 μm after the grinding. Meanwhile, a polishing solution (slurry) containing abrasive grains is used to polish the silicon substrate 211.

Subsequently, in a step illustrated in FIG. 6, a back-grinding tape 224 shown in FIG. 5 is removed, and an insulating film 212 is formed on the both surfaces 211A and 211B of the silicon substrate 211 and the surface of the portion of the silicon substrate 211 corresponding to the side surface of the through hole 216. For example, an oxide film may be used as the insulating film 212.

In a step illustrated in FIG. 7, the through electrode 213 is formed by a known method in the through hole 216 on which the insulating film 212 is formed, and the wiring 214 is then formed. As a result, the substrate 200 is thus manufactured (see e.g., Japanese Patent No. 3816484).

FIGS. 8 to 10 are views to describe problems of the method of manufacturing the substrate in the related art. In FIGS. 8 to 10, the same components as those of the above-mentioned structure shown in FIGS. 2 to 7 are represented by the same reference numerals.

However, when the through hole 216 is formed by the Bosch process, acicular protrusions 227 made of silicon are formed on the portion of the silicon substrate 211 corresponding to the side surface of the through hole 216 as shown in FIG. 8.

Further, when the silicon substrate 211 is polished, abrasive grains 228 contained in the polishing solution (slurry) or polishing chips 229 adhere to the portion of the silicon substrate 211 corresponding to the side surface of the through hole 216 as shown in FIG. 9.

When the insulating film 212 is formed on the silicon substrate 211 that includes the acicular protrusions 227 and/ or the abrasive grains 228 and the polishing chips 229 and then the through electrode 213 is formed, as shown in FIG. 10, there is a problem in that the insulating film 212 is not formed on the portion of the silicon substrate 211 corresponding to the side surface of the through hole 216 if the acicular protrusions 227 are broken, or the insulating film 212 is not formed on the side surface of the through hole 216 where the abrasive grains 228 or the polishing chips 229 adhere. If the above-mentioned problem occurs, there has been a problem in that it is not possible to sufficiently ensure an insulating property between the silicon substrate 211 and the through electrode 213 by the insulating film 212 formed on the through hole 216.

SUMMARY

Exemplary embodiments of the present invention address the above disadvantages and other disadvantages not described above. However, the present invention is not required to overcome the disadvantages described above, and thus, an exemplary embodiment of the present invention may not overcome any of the problems described above.

The present invention has been made in consideration of the above-mentioned problems, and it is an aspect of the present invention to provide a method of manufacturing a substrate that can sufficiently ensure an insulating property between a silicon substrate and a through electrode by an insulating film formed on the through hole.

According to one or more aspects of the present invention, there is provided a method of manufacturing a substrate that includes a silicon substrate, a through hole formed in the silicon substrate, and a through electrode formed in the through hole and being insulated form the silicon substrate. The method includes: (a) forming the through hole by etching the silicon substrate from a first surface of the silicon substrate by a Bosch process; (b) forming a thermal oxide film such that the thermal oxide film covers the first surface of the silicon substrate, a second surface of the silicon substrate opposite to the first surface, and a surface of the silicon substrate corresponding to a side surface of the through hole, by thermally oxidizing the silicon substrate where the through hole is formed; (c) removing the thermal oxide film; (d) forming an insulating film such that the insulating film covers the first and second surfaces of the silicon substrate and the surface of the silicon substrate corresponding to the side surface of the through hole; and (e) forming the through electrode in the through hole on which the insulating film is formed.

According to the present invention, the method includes: etching the silicon substrate from the first surface of the silicon substrate by the Bosch process in order to form the through hole; forming the thermal oxide film such that the thermal oxide film covers the first surface of the silicon substrate, the second surface of the silicon substrate opposite to the first surface, and the surface of the silicon substrate corresponding to the side surface of the through hole, by thermally oxidizing the silicon substrate where the through hole is formed; and removing the thermal oxide film. Accordingly, in the thermal oxide film forming step, all of the acicular protrusions made of silicon, which are formed when the through hole is formed, become a part of the thermal oxide film; and the thermally oxidized acicular protrusions can be removed together with the thermal oxide film in the thermal oxide film removing step. For this reason, since the defects are not formed on the insulating film formed on the surface of the silicon substrate corresponding to the side surface of the through hole after the thermal oxide film removing step, it is possible to sufficiently ensure an insulating property between the silicon substrate and the through electrode by the insulating film.

According to one or more aspects of the present invention, the method further includes: (f) removing a notch by grinding a portion of the silicon substrate where the notch is formed, from the second surface side, if the notch is formed at the end of the through hole positioned on the second surface side of the silicon substrate in step (a).

According to the present invention, it is possible to form the through hole in a preferable shape without a notch. Furthermore, if the silicon substrate is ground in the thermal oxide film removing step, it is possible to remove the abrasive grains or the polishing chips, which adhere to the side surface of the through hole, together with the thermal oxide film. Therefore, since defects are not formed in the insulating film formed on the surface of the silicon substrate corresponding to the side surface of the through hole after the thermal oxide film removing step, it is possible to sufficiently ensure an insulating property between the silicon substrate and the through electrode by the insulating film.

According to one or more aspects of the present invention, there is provided a method of manufacturing a substrate that includes a silicon substrate, a through hole formed in the silicon substrate, and a through electrode formed in the through hole and being insulated form the silicon substrate. The method includes: (a) forming the through hole by etching the silicon substrate from a first surface of the silicon substrate by a Bosch process; (b) etching a portion of the silicon substrate corresponding to at least a side surface of the through hole, by wet etching; (c) forming an insulating film such that the insulating film covers the first surface of the silicon substrate, a second surface of the silicon substrate opposite to the first surface, and a surface of the silicon substrate corresponding to the side surface of the through hole; and (d) forming the through electrode in the through hole on which the insulating film is formed.

According to the present invention, the method includes: etching the silicon substrate from the first surface of the silicon substrate by the Bosch process in order to form the through hole; removing the portion of the silicon substrate corresponding to the side surface of the through hole by wet etching; and forming the insulating film such that the insulating film covers the first and second surfaces of the silicon substrate and the surface of the silicon substrate corresponding to the side surface of the through hole. Accordingly, in the wet etching step, it is possible to remove the acicular protrusions made of silicon that are formed when the through hole is formed. Therefore, since defects are not formed in the insulating film formed on the surface of the silicon substrate corresponding to the side surface of the through hole after the wet etching step, it is possible to sufficiently ensure an insulating property between the silicon substrate and the through electrode by the insulating film.

According to one or more aspects of the present invention, the method further includes: (e) removing a notch by grinding a portion of the silicon substrate where the notch is formed, from the second surface side, if the notch is formed at the end of the through hole positioned on the second surface side of the silicon substrate in step (a). Step (e) is performed before step (b).

According to the present invention, it is possible to form the through hole in a preferable shape without a notch. Furthermore, if the silicon substrate is ground in the wet etching step, it is possible to remove the abrasive grains or the polishing chips, which adhere to the side surface of the through hole, together with the portion of the silicon substrate corresponding to the side surface of the through hole.

According to one or more aspects of the present invention, there is provided a method of manufacturing a substrate that includes a silicon substrate, a through hole formed in the silicon substrate, and a through electrode formed in the through hole and being insulated form the silicon substrate. The method includes: (a) forming a hole by etching the silicon substrate from a first surface of the silicon substrate by a Bosch process; (b) grinding the silicon substrate from a second surface of the silicon substrate opposite to the first surface such that the hole is the through hole passing through the silicon substrate; (c) forming a thermal oxide film such that the thermal oxide film covers the first surface of the silicon substrate, the second surface of the silicon substrate and a surface of the silicon substrate corresponding to a side surface of the through hole, by thermally oxidizing the silicon substrate where the through hole is formed; (d) removing the thermal oxide film; (e) forming an insulating film such that the insulating film covers the first and second surfaces of the silicon substrate and the surface of the silicon substrate corresponding to the side surface of the through hole; and (f) forming the through electrode in the through hole on which the insulating film is formed.

According to one or more aspects of the present invention, there is provided a method of manufacturing a substrate that includes a silicon substrate, a through hole formed in the silicon substrate, and a through electrode formed in the through hole and being insulated form the silicon substrate. The method includes: (a) forming a hole by etching the silicon substrate from a first surface of the silicon substrate by a Bosch process; (b) forming a thermal oxide film such that the thermal oxide film covers the first surface of the silicon substrate, a second surface of the silicon substrate opposite to the first surface, and surfaces of the silicon substrate corresponding to a side surface and a bottom surface of the hole, by thermally oxidizing the silicon substrate where the hole is formed; (c) grinding the silicon substrate from the second surface such that the hole is the through hole passing through the silicon substrate; (d) removing the thermal oxide film; (e) forming an insulating film such that the insulating film covers the first and second surfaces of the silicon substrate and a surface of the silicon substrate corresponding to a side surface of the through hole; and (f) forming the through electrode in the through hole on which the insulating film is formed.

According to one or more aspects of the present invention, there is provided a method of manufacturing a substrate that includes a silicon substrate, a through hole formed in the silicon substrate, and a through electrode formed in the through hole and being insulated form the silicon substrate. The method includes: (a) forming a hole by etching the silicon substrate from a first surface of the silicon substrate by a Bosch process; (b) grinding the silicon substrate from a second surface of the silicon substrate opposite to the first surface such that the hole is the through hole passing through the silicon substrate; (c) etching a portion of the silicon substrate corresponding to at least a side surface of the through hole, by wet etching; (d) forming an insulating film such that the insulating film covers the first surface of the silicon substrate, a second surface of the silicon substrate opposite to the first surface, and a surface of the silicon substrate corresponding to the side surface of the through hole; and (e) forming the through electrode in the through hole on which the insulating film is formed.

Other aspects and advantages of the present invention will be apparent from the following description, the drawings, and the claims.

DETAILED DESCRIPTION OF EXEMPLARY EMBODIMENTS

Exemplary embodiments of the present invention will be described with reference to drawings hereinafter.

First Embodiment

Figure 1:
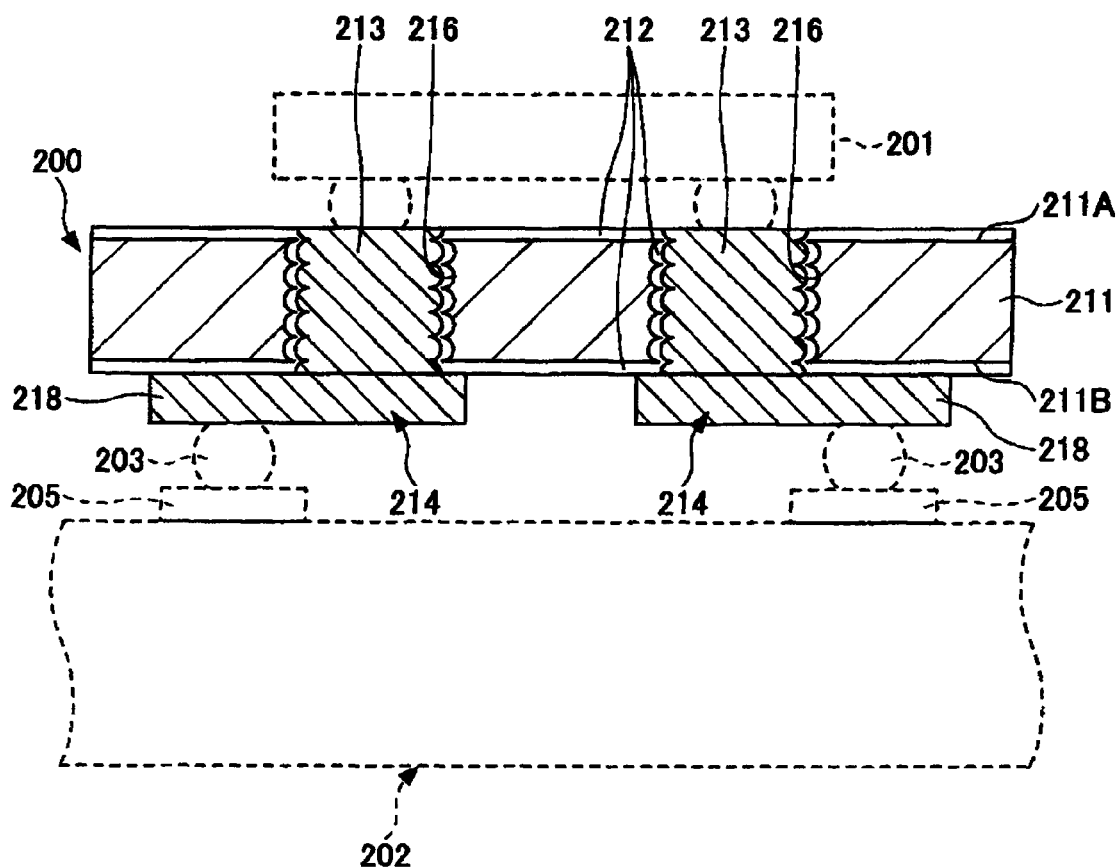
FIG. 1 is a cross-sectional view of a substrate in the related art.
Figure 2:
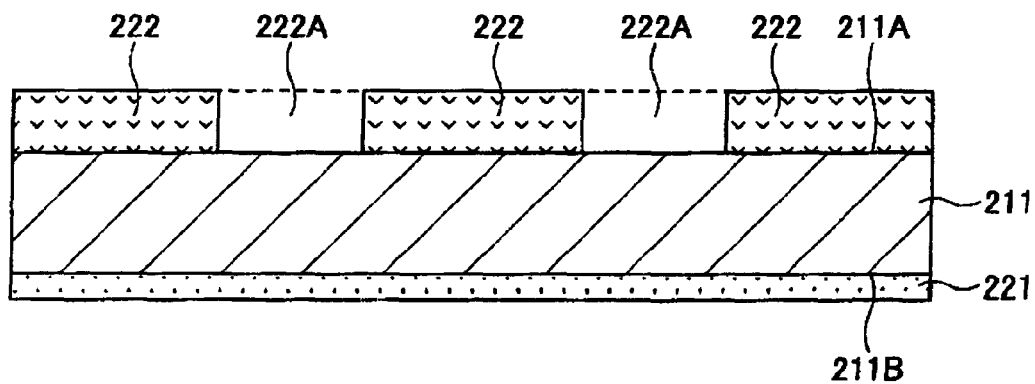
FIG. 2 is a view (#1) illustrating a step of manufacturing the substrate in the related art.
Figure 3:
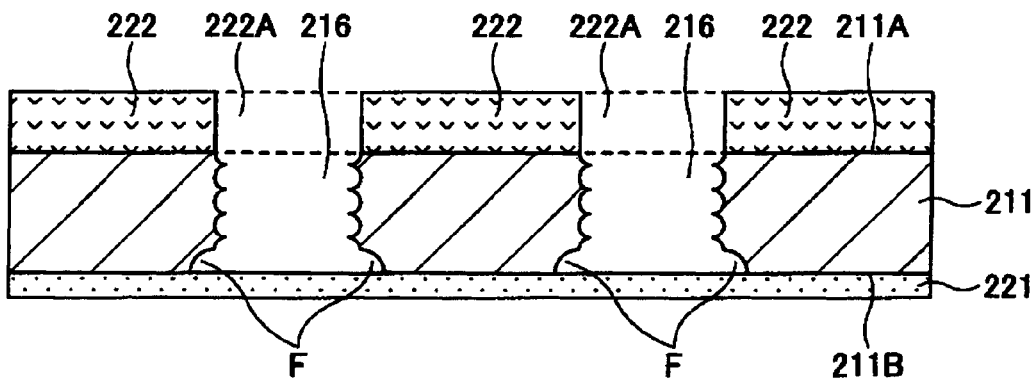
FIG. 3 is a view (#2) illustrating a step of manufacturing the substrate in the related art.
Figure 4:
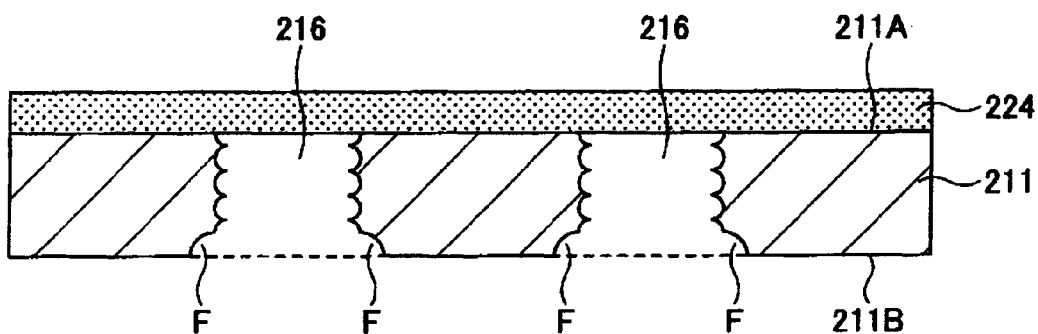
FIG. 4 is a view (#3) illustrating a step of manufacturing the substrate in the related art.
Figure 5:
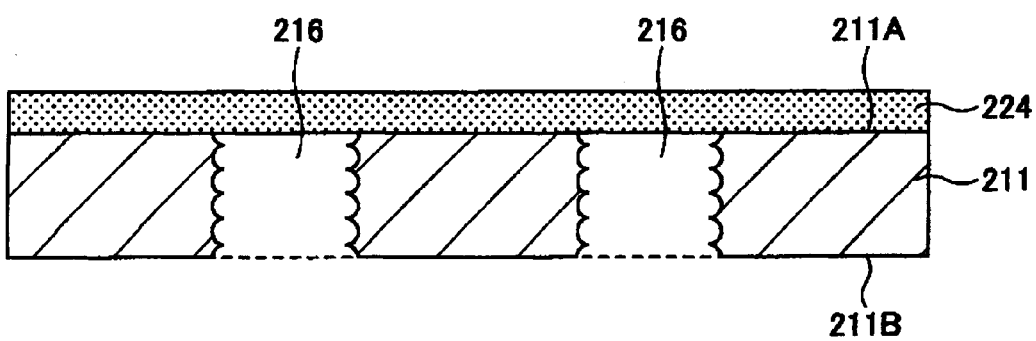
FIG. 5 is a view (#4) illustrating a step of manufacturing the substrate in the related art.
Figure 6:
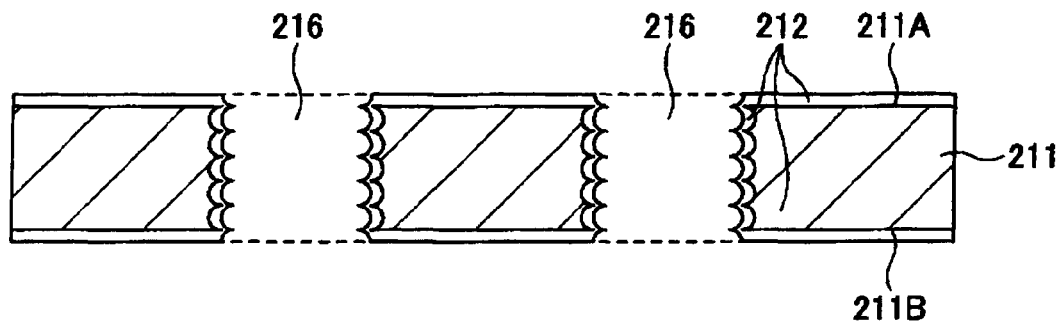
FIG. 6 is a view (#5) illustrating a step of manufacturing the substrate in the related art.
Figure 7:
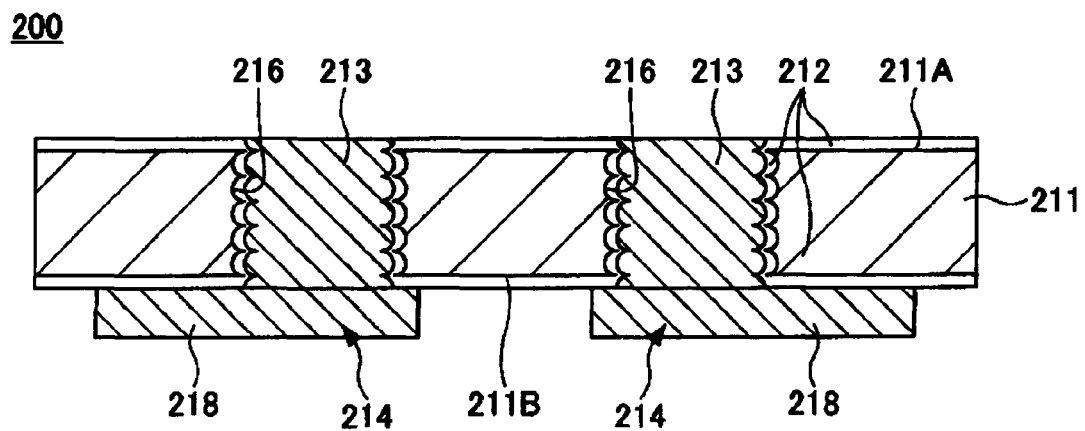
FIG. 7 is a view (#6) illustrating a step of manufacturing the substrate in the related art.
Figure 8:
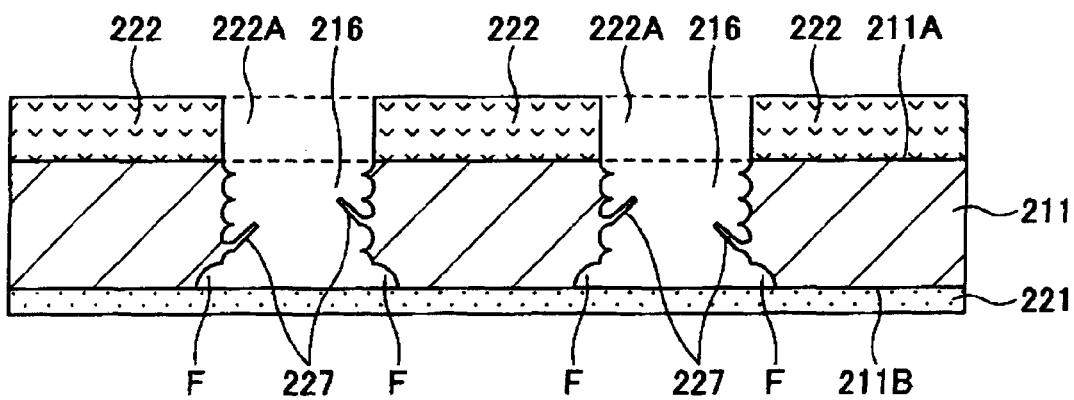
FIG. 8 is a cross-sectional view (#1) to describe a problem of a method of manufacturing the substrate in the related art.
Figure 9:
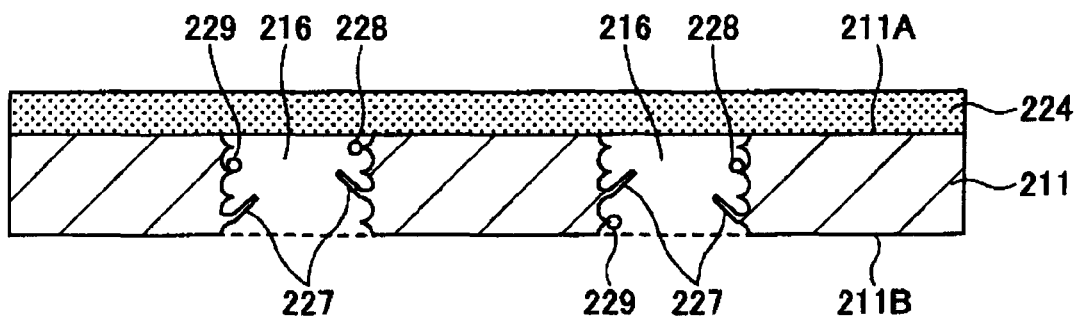
FIG. 9 is a cross-sectional view (#2) to describe a problem of the method of manufacturing the substrate in the related art.
Figure 10:
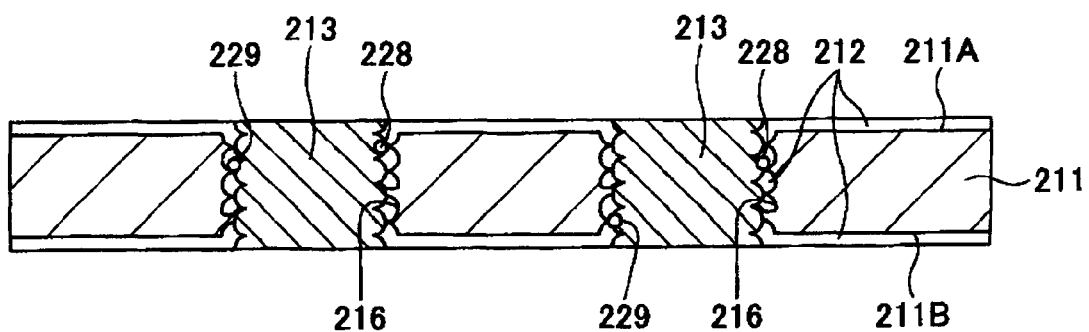
FIG. 10 is a cross-sectional view (#3) illustrating a problem of the method of manufacturing the substrate in the related art.
Figure 11:
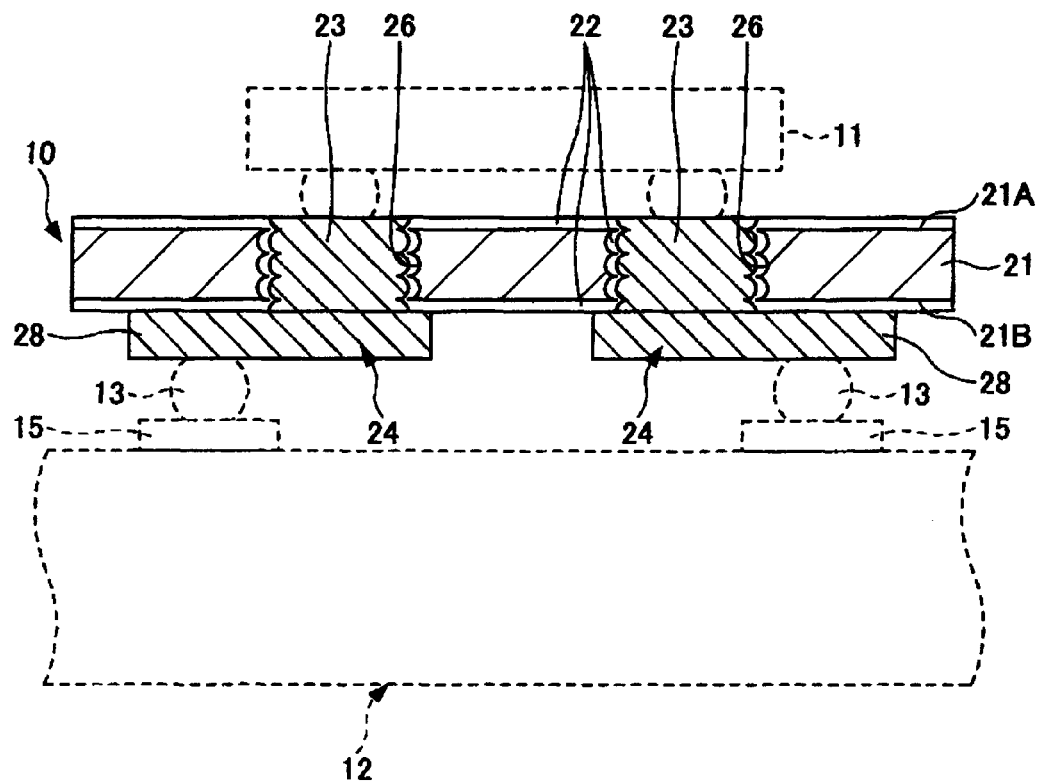
FIG. 11 is a cross-sectional view of a substrate according to a first embodiment of the present invention.

FIG. 11 is a cross-sectional view of a substrate according to a first embodiment of the invention.

Referring to FIG. 11, a substrate 10 includes a silicon substrate 21, an insulating film 22, a through electrode 23, and wiring 24. The silicon substrate 21 is formed into a plate shape, and includes a through hole 26. The through hole 26 is formed by a Bosch process. The Bosch process is a deep etching technique for silicon, specifically, an etching method of repeatedly performing etching (etching step) and etched sidewall protection (protecting step). Isotropic etching is performed using sulfur hexafluoride ($SF_6$) in the etching step, and a sidewall is protected (etching performed in a transverse direction is controlled) using Teflon (registered trademark) gas (for example, $C_4F_8$) in the protecting step. Since the etching step and the protecting step are repeatedly performed in the Bosch process, the side surface of the through hole 26 formed by the Bosch process is formed into a scalloping shape (where fine unevenness is repeatedly formed). The thickness of the silicon substrate 21 may be, for example, 200 μm. The diameter of the through hole 23 may be, for example, 80 μm.

The insulating film 22 is formed to cover both surfaces 21A and 21B of the silicon substrate 21 and a surface of the silicon substrate 21 corresponding to the side surface of the through hole 26. The insulating film 22 is a film that insulates the silicon substrate 21 from the through electrode 23 and the wiring 24. For example, an oxide film, a thermal oxide film, a nitride film (for example, SiN film), which is formed by a CVD method, may be used as the insulating film 22. When the oxide film or the thermal oxide film is used as the insulating film 22, the thickness of the insulating film 22 may be in the range of, for example, 0.5 to 1.5 μm.

The through electrode 23 is formed in the through hole 26 on which the insulating film 22 is formed. The upper end of the through electrode 23 is a portion on which a semiconductor device 11 is mounted, and the lower end of the through electrode 23 is connected to the wiring 24. The through electrode 23 is an electrode that electrically connects the semiconductor device 11 with the wiring 24.

The wiring 24 is formed on the insulating film 22, which is formed on the lower surface 21B of the silicon substrate 21. The wiring 24 is connected to the lower end of the through electrode 23. The wiring 24 includes a pad portion 28 on which an external connection terminal 13 is provided. The pad portion 28 is electrically connected to a pad 15, which is provided on a mounting substrate 12 such as a mother board, through the external connection terminal 13. For example, Cu may be used as the material of the wiring 24. Further, the thickness of the wiring 24 may be, for example, 5.0 μm.

FIGS. 12 to 23 are views illustrating steps of manufacturing the substrate according to the first embodiment of the present invention. In FIGS. 12 to 23, reference character B indicates a cutting position where the silicon substrate 31 is cut (hereinafter, referred to as a "cutting position B"). Further, in FIGS. 12 to 23, the same components as those of the substrate 10 according to the first embodiment are represented by the same reference numerals.

Figure 12:
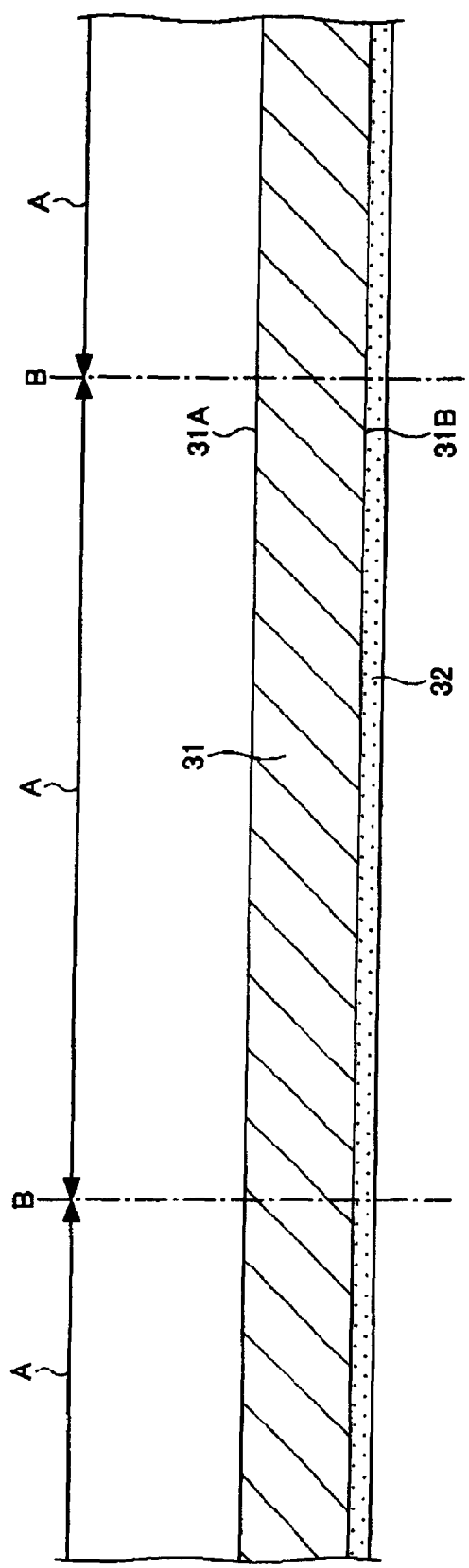
FIG. 12 is a view (#1) illustrating a step of manufacturing the substrate according to the first embodiment of the present invention.

First, in a step illustrated in FIG. 12, a silicon substrate 31 is prepared which has a plurality of substrate forming regions A where the substrates 10 are formed, and a protective tape 32 is attached to a lower surface 31B (second surface) of the silicon substrate 31. If the protective tape 32 is attached to the lower surface 31B of the silicon substrate 31 as described above, it is possible to prevent a stage (not shown) of an etching apparatus, which is used when the through hole 26 is formed by the Bosch process, from being etched during the formation of the through hole.

The silicon substrate 31 is cut or divided in a step illustrated in FIG. 23 to be described below, so that a silicon substrate 11 (see FIG. 11) used as one of components of the substrate 10 is formed. For example, a silicon wafer may be used as the silicon substrate 31. The thickness of the silicon substrate 31 may be, for example, 250 μm. For example, E-series (manufactured by LINTEC Corporation) may be used as the protective tape 32. The thickness of the protective tape 32 may be, for example, 150 μm.

Figure 13:
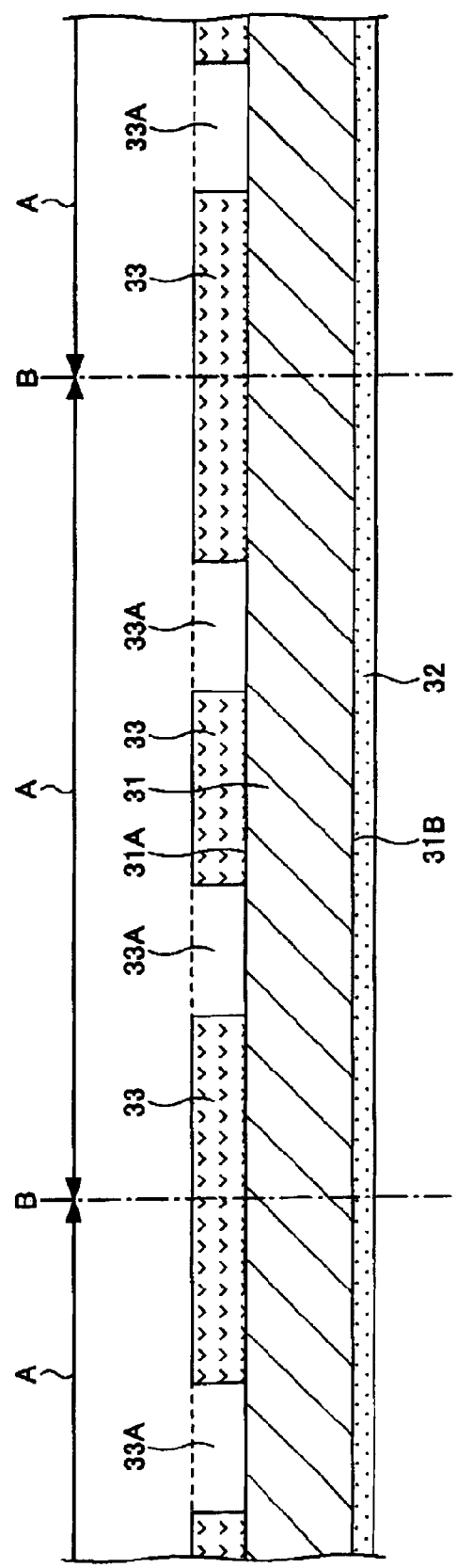
FIG. 13 is a view (#2) illustrating a step of manufacturing the substrate according to the first embodiment of the present invention.

Subsequently, in a step illustrated in FIG. 13, a resist film 33 having an opening 33A is formed on an upper surface 31A (first surface) of the silicon substrate 31. The opening 33A is formed such that the portion of the upper surface 31A of the silicon substrate 31 corresponding to a forming region of the through hole 26 is exposed to the outside.

Figure 14:
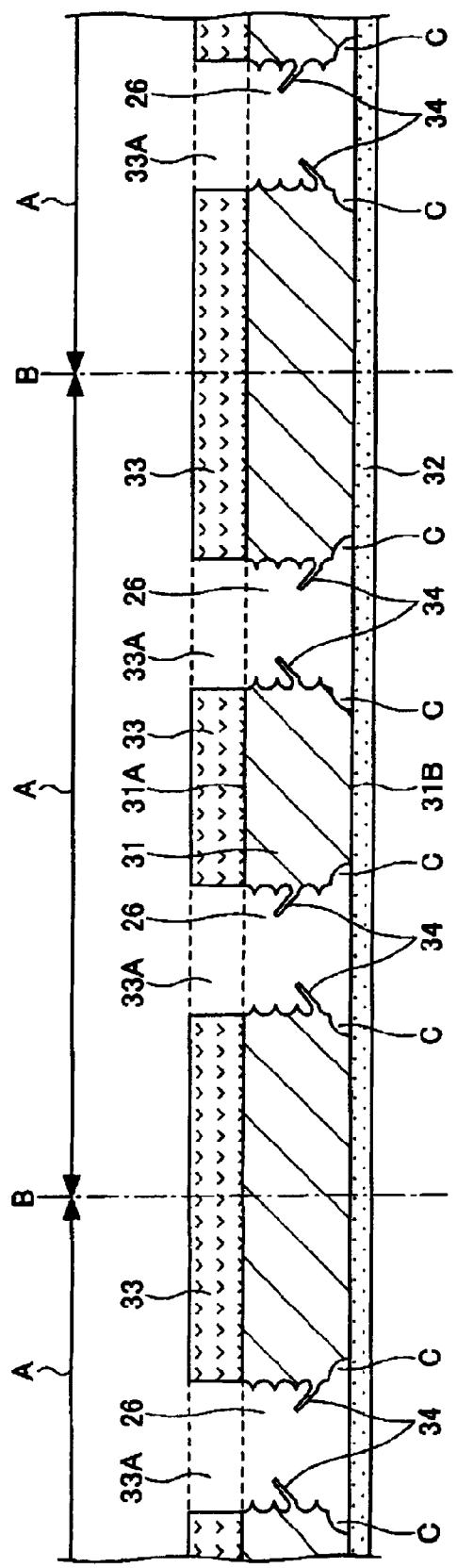
FIG. 14 is a view (#3) illustrating a step of manufacturing the substrate according to the first embodiment of the present invention.

In a step illustrated in FIG. 14, the portion of the silicon substrate 31, which is exposed to the outside through the opening 33A of the resist film 33, is etched by the Bosch process (the silicon substrate 31 is etched from the upper surface 31A), so that the through hole 26 is formed (through hole forming step). In this case, the portion of the silicon substrate 31, which corresponds to the side surface of the through hole 26, is formed into a scalloping shape. Further, acicular protrusions 34 made of silicon are formed on the portion of the silicon substrate 31 that corresponds to the side surface of the through hole 26. Furthermore, notches C may be formed at the lower end of the through hole 26 (at the portion of the silicon substrate 31 corresponding to the lower surface 31B (second surface)). In this embodiment, a case where the notches C are formed during the formation of the through hole 26 will be described below. Further, the depth of the through hole 26 in this step is larger than that of the through hole 26 shown in FIG. 11 so that the notches C can be removed by grinding the silicon substrate 31. If the depth of the through hole 26 shown in FIG. 11 is 200 μm, the depth of the through hole 26 in this step may be, for example, 250 μm.

Subsequently, in a step illustrated in FIG. 15, the protective tape 32 and the resist film 33 shown in FIG. 14 are removed and a back-grinding tape 36 is then attached to the upper surface 31A of the silicon substrate 31. For example, E-series (manufactured by LINTEC Corporation) may be used as the back-grinding tape 36. In this case, the thickness of the back-grinding tape 36 may be, for example, 150 μm.

Figure 15:
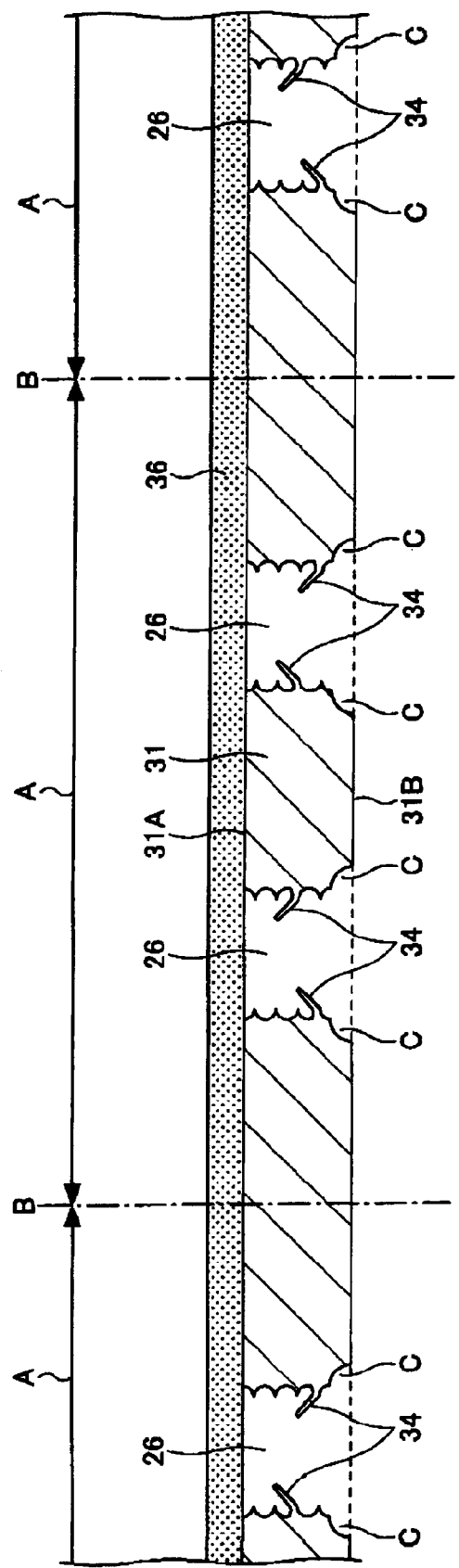
FIG. 15 is a view (#4) illustrating a step of manufacturing the substrate according to the first embodiment of the present invention.
Figure 16:
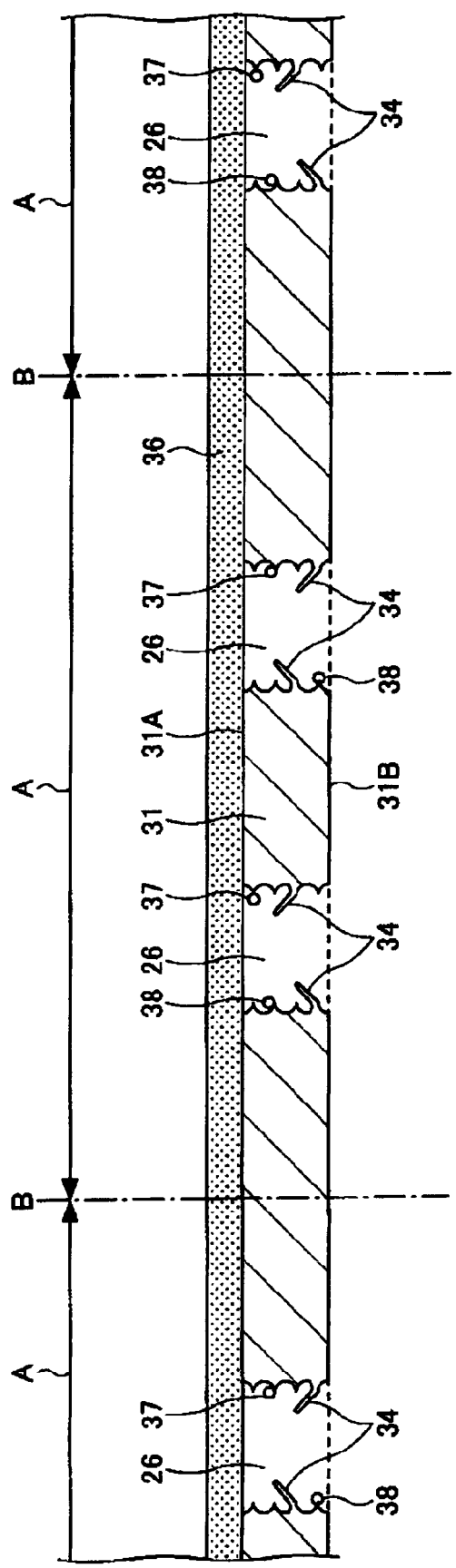
FIG. 16 is a view (#5) illustrating a step of manufacturing the substrate according to the first embodiment of the present invention.

In a step illustrated in FIG. 16, the portion of the silicon substrate 31 where the notches C shown in FIG. 15 are formed are removed by grinding the silicon substrate 31 from the lower surface 31B of the silicon substrate 31 (notch removing step).

The notches C are removed by grinding the silicon substrate 31 from the lower surface 31B of the silicon substrate 31 as described above, so that it is possible to form the through hole 26 in a preferable shape without the notches C.

In the notch removing step, the thickness of the silicon substrate 31 to be removed may be, for example, 50 μm. In this case, after the notch removing step, the depth of the through hole 26 may be, for example, 200 μm. Meanwhile, since a polishing solution (slurry) containing abrasive grains 37 is used to polish the silicon substrate 31, the abrasive grains 37 adhere to the surface of the silicon substrate 31 corresponding to the side surface of the through hole 26 as shown in FIG. 16. Further, polishing chips 38, which are generated during the polishing of the silicon substrate 31, also adhere to the surface of the silicon substrate 31 corresponding to the side surface of the through hole 26.

Figure 17:
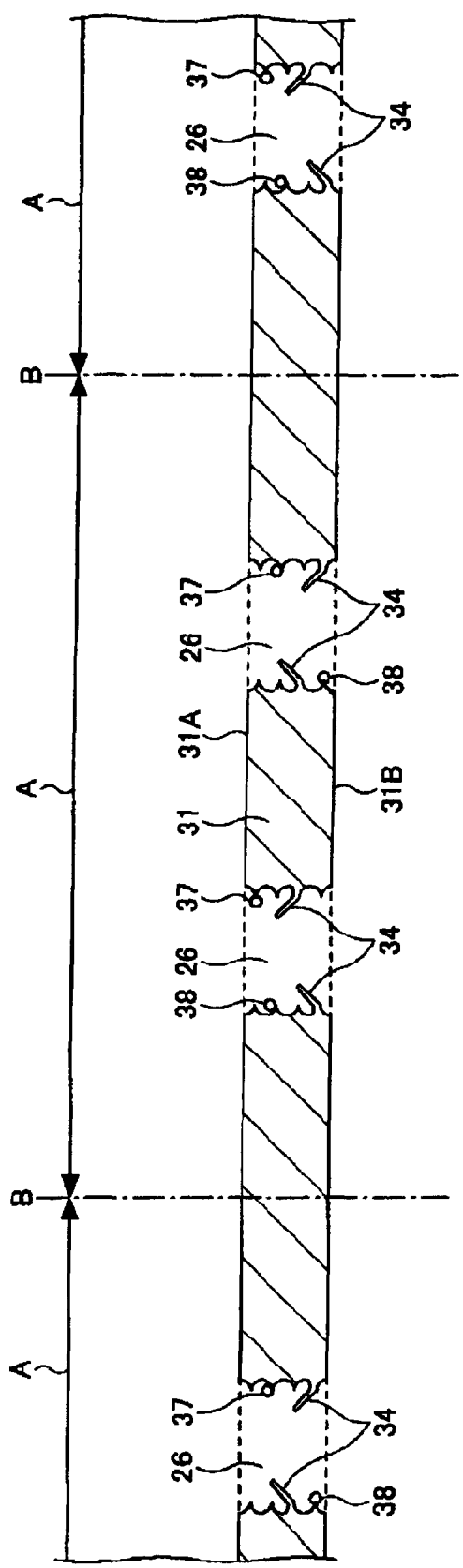
FIG. 17 is a view (#6 illustrating a step of manufacturing the substrate according to the first embodiment of the present invention.

Subsequently, the back-grinding tape 36 shown in FIG. 16 is removed in a step illustrated in FIG. 17. Then, in a step illustrated in FIG. 18, a thermal oxide film 39, which covers the both surfaces 31A and 31B of the silicon substrate 31 and the surface of the silicon substrate 31 corresponding to the side surface of the through hole 26, is formed by thermally oxidizing the structure shown in FIG. 17 (specifically, the silicon substrate 31 having the through hole 26, the acicular protrusions 34, and the abrasive grains 37 and the polishing chips 38 that adhere to the side surface of the through hole 26) (thermal oxide film forming step).

Meanwhile, since the thickness of the acicular protrusion 34 made of silicon is considerably small, the entire portion of the acicular protrusion 34 becomes a part of the thermal oxide film 39. Further, the portions of the silicon substrate 31, which have come in contact with the abrasive grains 37 and the polishing chips 38, become a part of the thermal oxide film 39 in a step illustrated in FIG. 17. For this reason, the thermal oxide film 39 is formed between the abrasive grains 37 and the polishing chips 38 and the surface of the silicon substrate 31 that corresponds to the side surface of the through hole 26. The thickness of the thermal oxide film 39 may be in the range of, for example, 0.5 to 1.5 μm.

Figure 18:
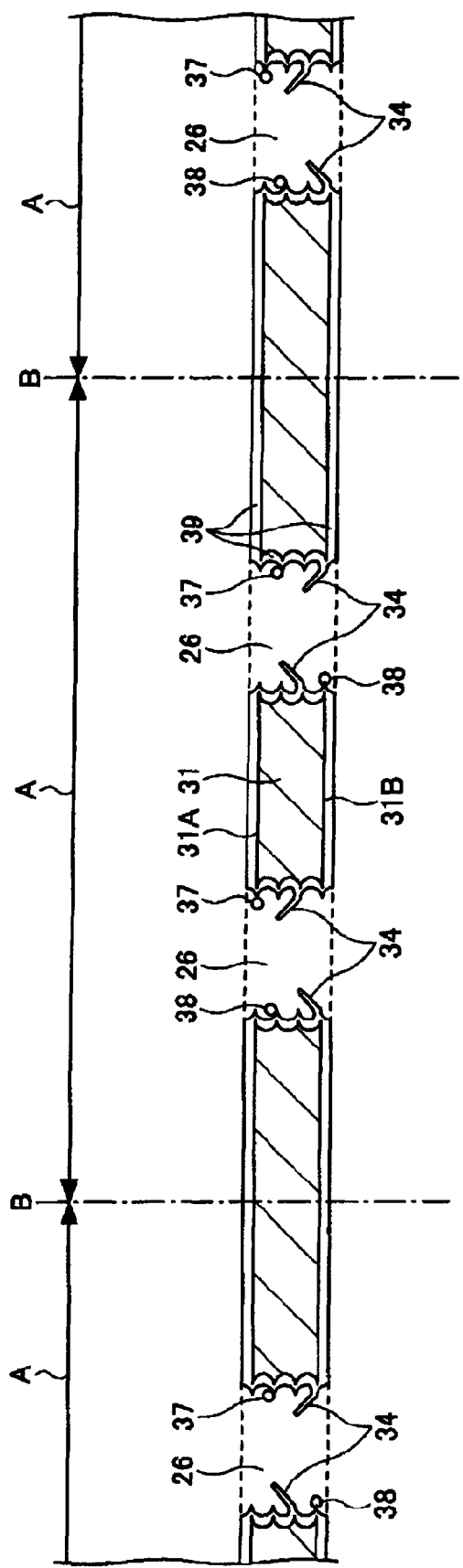
FIG. 18 is a view (#7) illustrating a step of manufacturing the substrate according to the first embodiment of the present invention.
Figure 19:
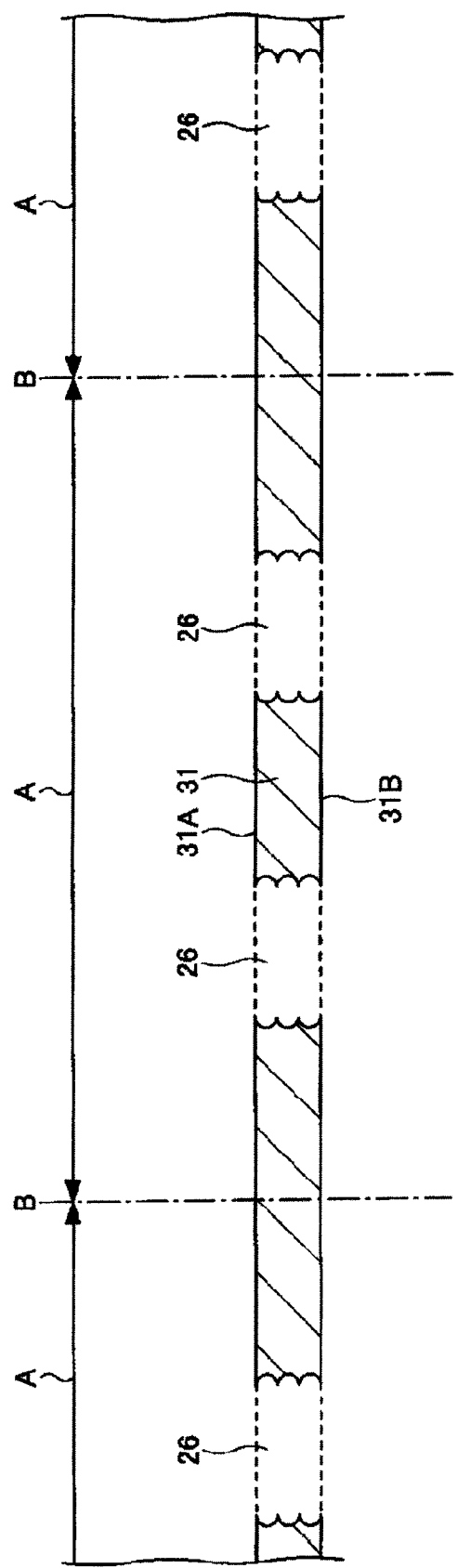
FIG. 19 is a view (#8) illustrating a step of manufacturing the substrate according to the first embodiment of the present invention.

In a step illustrated in FIG. 19, the entire thermal oxide film 39 shown in FIG. 18 is removed (thermal oxide film removing step). Specifically, the thermal oxide film 39 is removed by wet etching. For example, a hydrogen fluoride aqueous solution (0.5%), a buffered hydrofluoric acid may be used as an etchant that is used to remove the thermal oxide film 39. After the removal of the thermal oxide film 39, the diameter of the through hole 26 may be, for example, 80 μm.

As described above, after the through hole forming step and the notch removing step, the thermal oxide film 39, which covers the both surfaces 31A and 31B (first and second surfaces) of the silicon substrate 31 and the surface of the silicon substrate 31 corresponding to the side surface of the through hole 26, is formed by thermally oxidizing the silicon substrate 31, which has the through hole 26, the acicular protrusions 34, and the abrasive grains 37 and the polishing chips 38 adhering to the side surface of the through hole 26. After that, the thermal oxide film 39 formed on the silicon substrate 31 is removed, so that it is possible to remove the thermal oxide film 39, the acicular protrusions 34, the abrasive grains 37, and the polishing chips 38. Accordingly, in a step illustrated in FIG. 20 (insulating film forming step) to be described below, it is possible to form an insulating film 22 without defects on the surface of the silicon substrate 31 that corresponds to the side surface of the through hole 26. As a result, it is possible to sufficiently ensure an insulating property between the through electrode 23 formed in the through hole 26 and the silicon substrate 31 by the insulating film 22 that is formed on the surface of the silicon substrate 31 corresponding to the side surface of the through hole 26.

Figure 20:
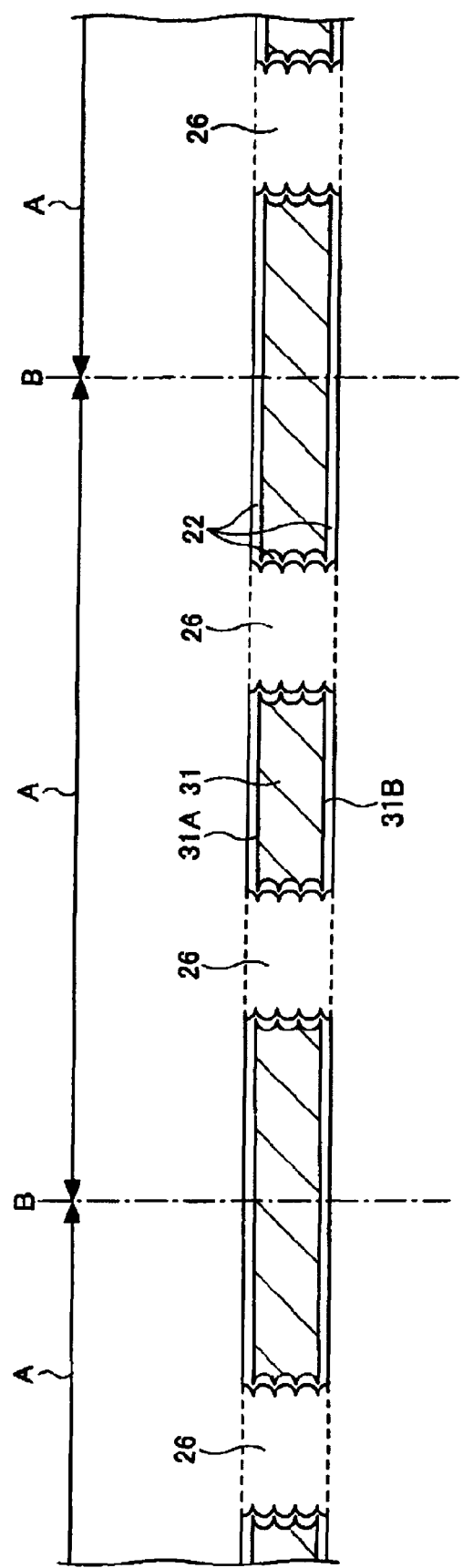
FIG. 20 is a view (#9) illustrating a step of manufacturing the substrate according to the first embodiment of the present invention.

Subsequently, in a step illustrated in FIG. 20, the insulating film 22 is formed to cover the both surfaces 31A and 31B of the silicon substrate 31 and the surface of the silicon substrate 31 corresponding to the side surface of the through hole 26 (insulating film forming step). For example, an oxide film, a thermal oxide film, a nitride film (for example, SiN film), which is formed by a CVD method, may be used as the insulating film 22. When the oxide film or the thermal oxide film is used as the insulating film 22, the thickness of the insulating film 22 may be in the range of, for example, 0.5 to 1.5 μm.

Figure 21:
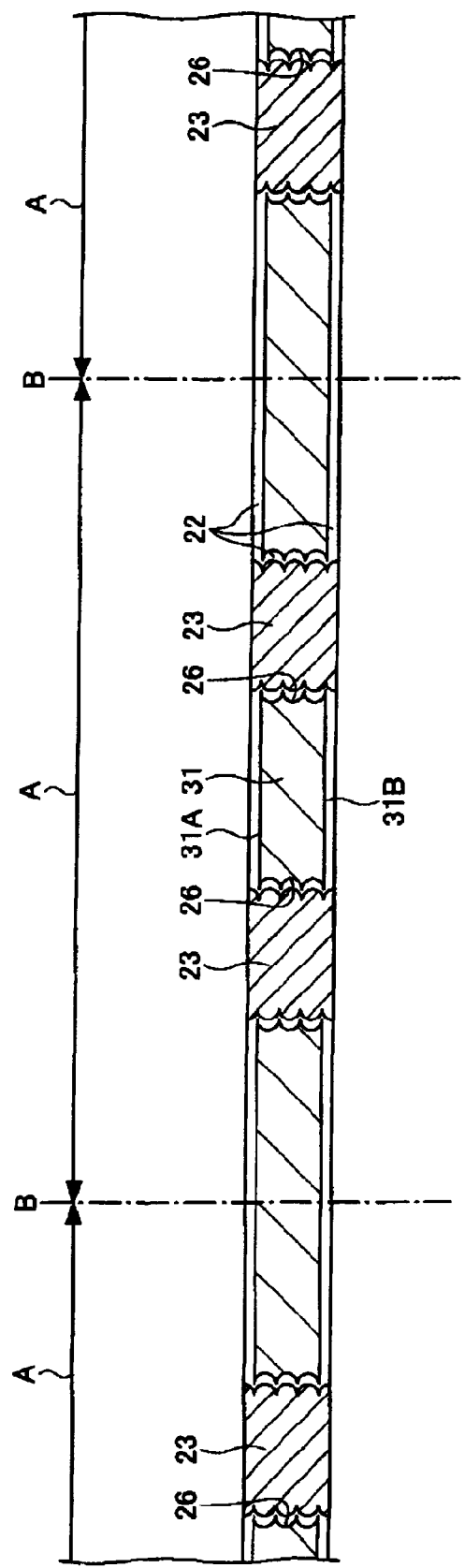
FIG. 21 is a view (#10) illustrating a step of manufacturing the substrate according to the first embodiment of the present invention.

In a step illustrated in FIG. 21, a through electrode 23 is formed by a known method in the through hole 26 on which the insulating film 22 is formed (through electrode forming step). Specifically, for example, a metal foil (for example, Cu foil) is attached to the insulating film 22 formed on the surface 31B of the silicon substrate 31 and a plating film (for example, Cu plating film) is deposited and grown to fill the through hole 26 by an electrolytic plating method that uses the metal foil as a power supply layer, so that the through electrode 23 is formed. Meanwhile, when the wiring 24 is formed by a subtractive method, the metal foil may be used as a base material of the wiring 24 in a step illustrated in FIG. 22 to be described below.

Figure 22:
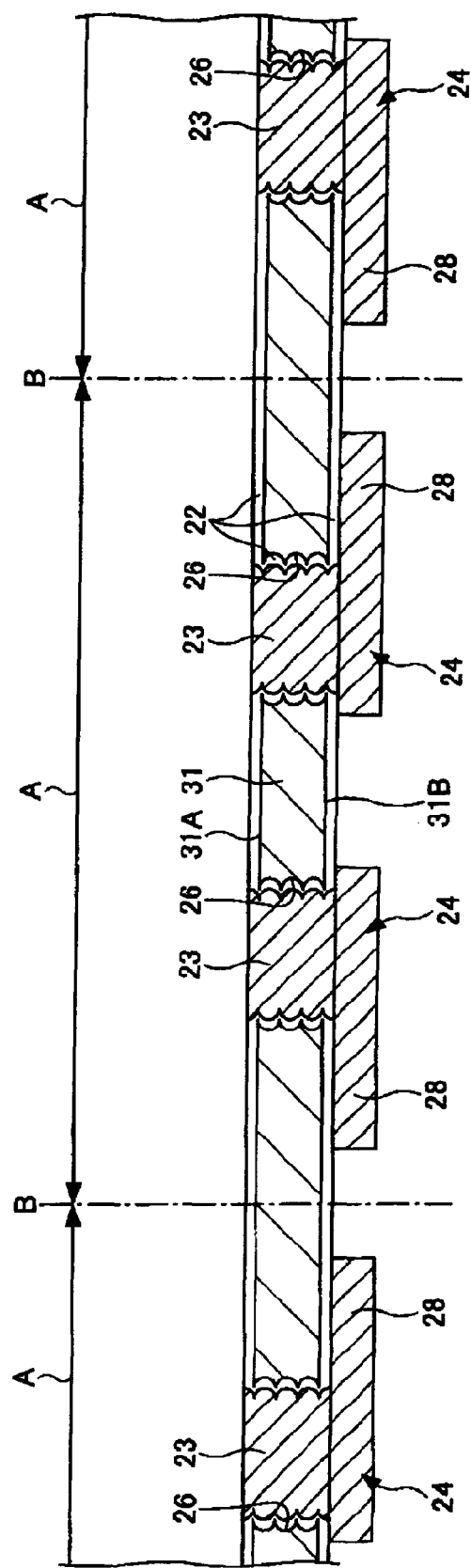
FIG. 22 is a view (#11) illustrating a step of manufacturing the substrate according to the first embodiment of the present invention.

In a step illustrated in FIG. 22, the wiring 24 connected to the lower end of the through electrode 23 is formed on the portion of the insulating film 22, which is formed on the lower surface 31B of the silicon substrate 31, by a known method (wiring forming step). Specifically, for example, the wiring 24 is formed by patterning the metal foil (Cu foil) described in the step illustrated in FIG. 21 (subtractive method). Accordingly, a plurality of structures corresponding to the substrates 10 is formed in the silicon substrate 31. The thickness of the wiring 24 may be, for example, 5.0 μm. Meanwhile, the wiring 24 may be formed by, for example, a semi-additive method.

Figure 23:
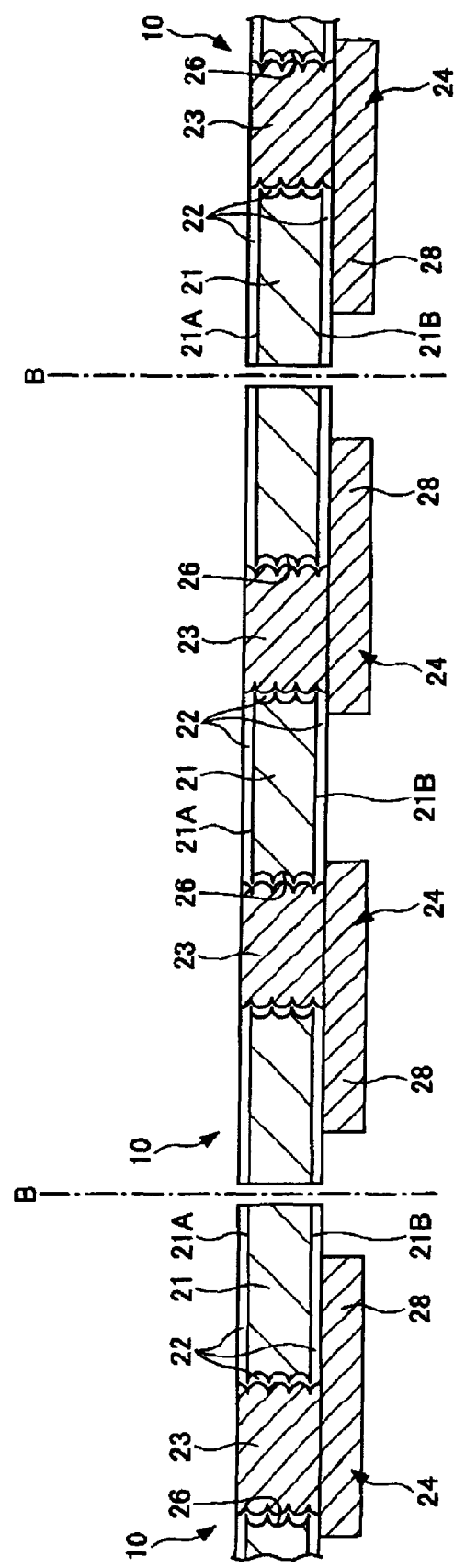
FIG. 23 is a view (#12) illustrating a step of manufacturing the substrate according to the first embodiment of the present invention.

Then, the silicon substrate 31 is cut along the cutting position B in a step illustrated in FIG. 23. Accordingly, the structures corresponding to the plurality of substrates 10 are divided, so that the plurality of substrates 10 is manufactured.

In the method of manufacturing a substrate according to this embodiment, the silicon substrate 31 is etched by the Bosch process in order to form the through hole 26; the thermal oxide film 39, which covers the both surfaces 31A and 31B of the silicon substrate 31 and the surface of the silicon substrate 31 corresponding to the side surface of the through hole 26, is formed by thermally oxidizing the silicon substrate 31 having the through hole 26; and the thermal oxide film 39 is removed. Accordingly, in the thermal oxide film forming step, all of the acicular protrusions 34 made of silicon, which are formed when the through hole 26 is formed, become a part of the thermal oxide film 39; and the acicular protrusions 34 and the thermally oxidized abrasive grains 37 and the polishing chips 38, which adhere to the side surface of the through hole 26, can be removed together with the thermal oxide film 39 in the thermal oxide film removing step because the thermal oxide film 39 is formed between the silicon substrate 31 and the abrasive grains 37 and the polishing chips 38 adhering to the side surface of the through hole 26. Therefore, since defects are not formed in the insulating film 22 formed on the surface of the silicon substrate 31 corresponding to the side surface of the through hole 26 after the thermal oxide film removing step, it is possible to sufficiently ensure an insulating property between the silicon substrate 31 and the through electrode 23 by the insulating film 22 that is formed on the surface of the silicon substrate 31 corresponding to the side surface of the through hole 26.

Second Embodiment

Figure 24:
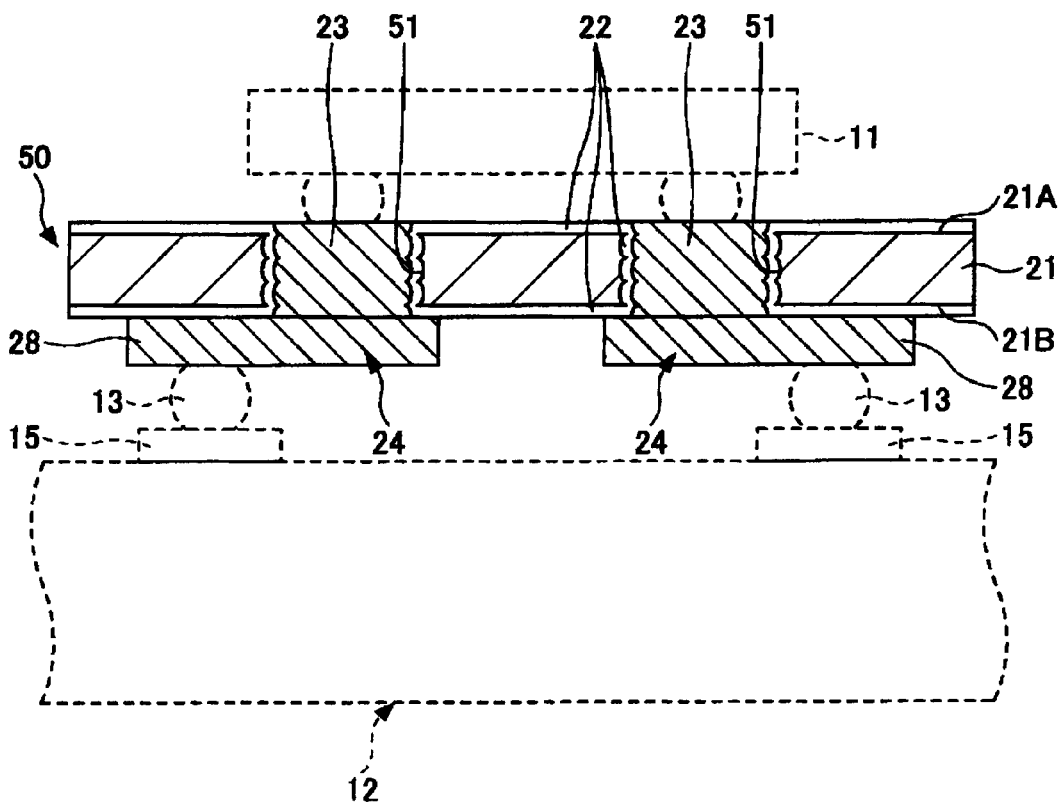
FIG. 24 is a cross-sectional view of a substrate according to a second embodiment of the present invention.

FIG. 24 is a cross-sectional view of a substrate according to a second embodiment of the present invention. In FIG. 24, the same components as those of the substrate 10 according to the first embodiment are represented by the same reference numerals.

Referring to FIG. 24, a substrate 50 according to a second embodiment has the same configuration as the substrate 10 except that a through hole 51 is formed instead of the through hole 26 formed in the substrate 10 according to the first embodiment.

The through hole 51 has the same configuration as the through hole 26 except that the scalloping shape of a portion of the silicon substrate 21 corresponding to the side surface of the through hole 51 is smoother than the scalloping shape of the portion of the silicon substrate 21 corresponding to the side surface of the through hole 26 formed in the substrate 10.

FIGS. 25 to 28 are views illustrating steps of manufacturing the substrate according to the second embodiment of the present invention. In FIGS. 25 to 28, the same components as those of the structure of FIG. 17 described in the first embodiment and the substrate 50 according to the second embodiment are represented by the same reference numerals.

A method of manufacturing the substrate 50 according to the second embodiment will be described with reference to FIGS. 25 to 28. First, in a step illustrated in FIG. 25, the structure shown in FIG. 25 (specifically, the silicon substrate 31 having the through hole 51, the acicular protrusions 34, and the abrasive grains 37 and the polishing chips 38 that adhere to the side surface of the through hole 51) is formed by performing the same steps as the steps of FIGS. 12 to 17 described in the first embodiment. In this step, the scalloping shape of the portion of the silicon substrate 31 corresponding to the side surface of the through hole 51 has unevenness larger than that of the through hole 51 shown in FIG. 24.

Figure 26:
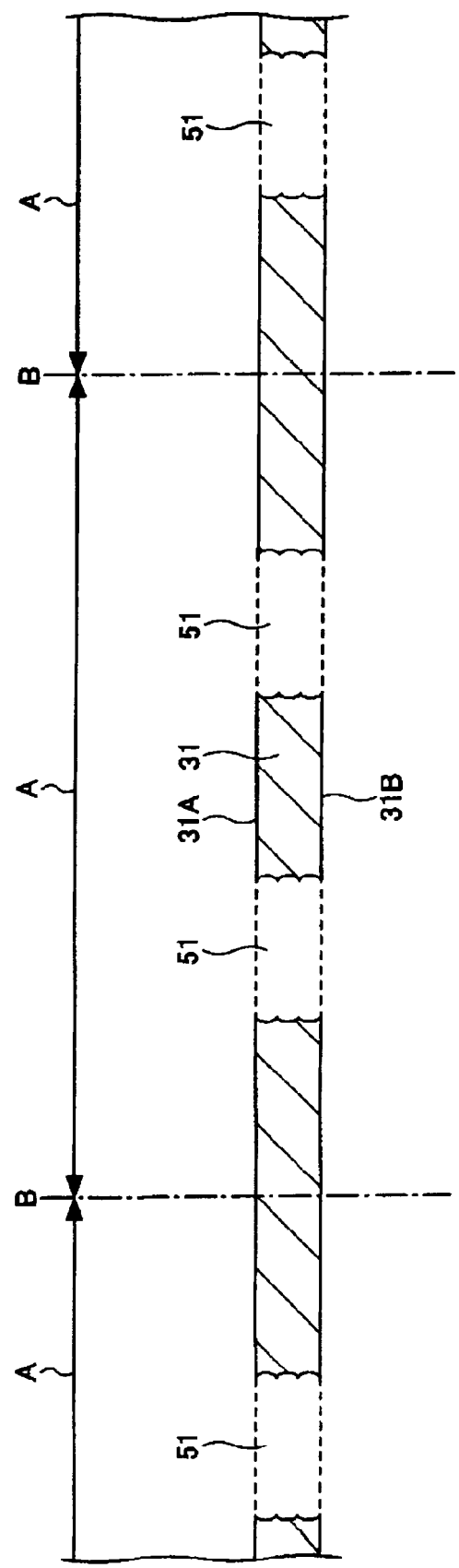
FIG. 26 is a view (#2) illustrating a step of manufacturing the substrate according to the second embodiment of the present invention.

In a step illustrated in FIG. 26, the portion of the silicon substrate 31 corresponding to at least the side surface of the through hole 51 is etched by wet etching (wet etching step). For example, an alkaline solution may be used as the etchant that is used to etch the silicon substrate 31. For example, a KOH solution or TMAH (tetramethylammonium hydroxide) may be used as the specific alkaline solution. Further, in the wet etching step, the etching depth of the silicon substrate 31 may be, for example, 1.5 μm.

Figure 25:
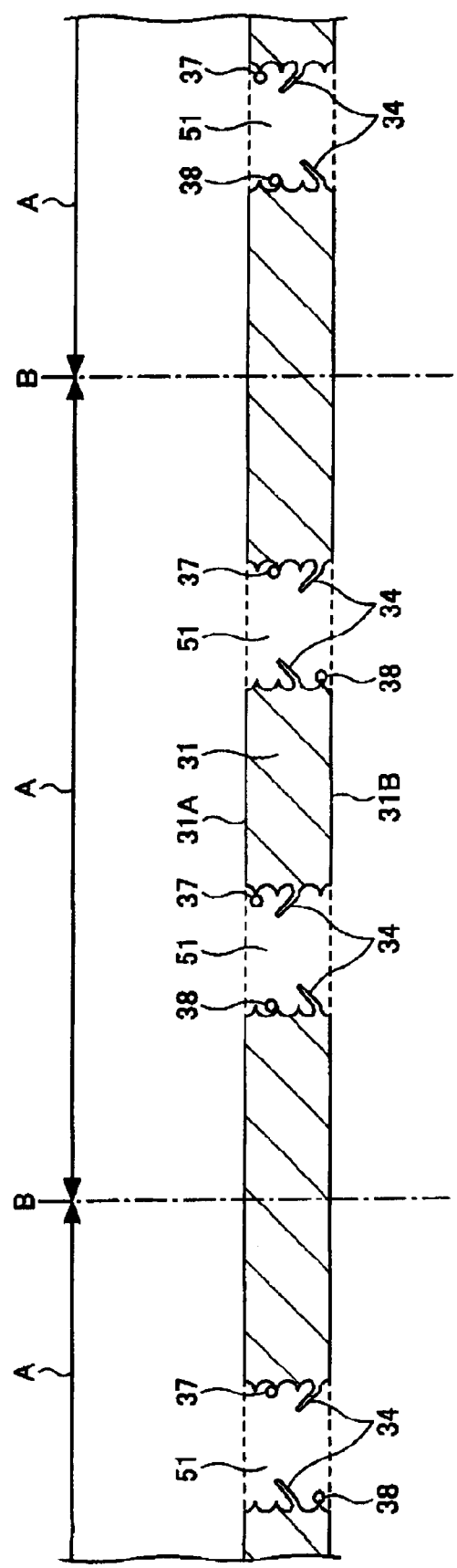
FIG. 25 is a view (#1) illustrating a step of manufacturing the substrate according to the second embodiment of the present invention.

It is possible to remove acicular protrusions 34 made of silicon, abrasive grains 37, and polishing chips 38 that are shown in FIG. 25 by performing wet etching on the portion of the silicon substrate 31 corresponding to the side surface of the through hole 51 as described above. Accordingly, it is possible to form the insulating film 22 without defects on the surface of the silicon substrate 31 that corresponds to the side surface of the through hole 51 from which the acicular protrusions 34, the abrasive grains 37, and the polishing chips 38 are removed. As a result, it is possible to sufficiently ensure an insulating property between the through electrode 23 formed in the through hole 51 and the silicon substrate 31 by the insulating film 22 that is formed on the portion of the silicon substrate 31 corresponding to the side surface of the through hole 51.

The unevenness of the portion having a scalloping shape is reduced by performing wet etching on the portion of the silicon substrate 31 corresponding to the side surface of the through hole 51 that is formed in the scalloping shape. For this reason, since a convex portion has a round shape, it is possible to suppress the formation of the defects on the insulating film 22 that is formed on the side surface of the through hole 51.

Further, in the wet etching step, wet etching may be performed on the entire surface of the silicon substrate 31 shown in FIG. 25 (specifically, on the both surfaces 31A and 31B of the silicon substrate 31 and the surface of the silicon substrate 31 corresponding to the side surface of the through hole 51).

Accordingly, when the abrasive grains 37 or the polishing chips 38 adhere to the lower surface 31B of the silicon substrate 31, it is possible to remove the abrasive grains 37 or the polishing chips 38 that adhere to the lower surface 31B of the silicon substrate 31. Meanwhile, a case where wet etching is performed on the entire surface of the silicon substrate 31 shown in FIG. 25 is shown in FIG. 26 as an example.

Figure 27:
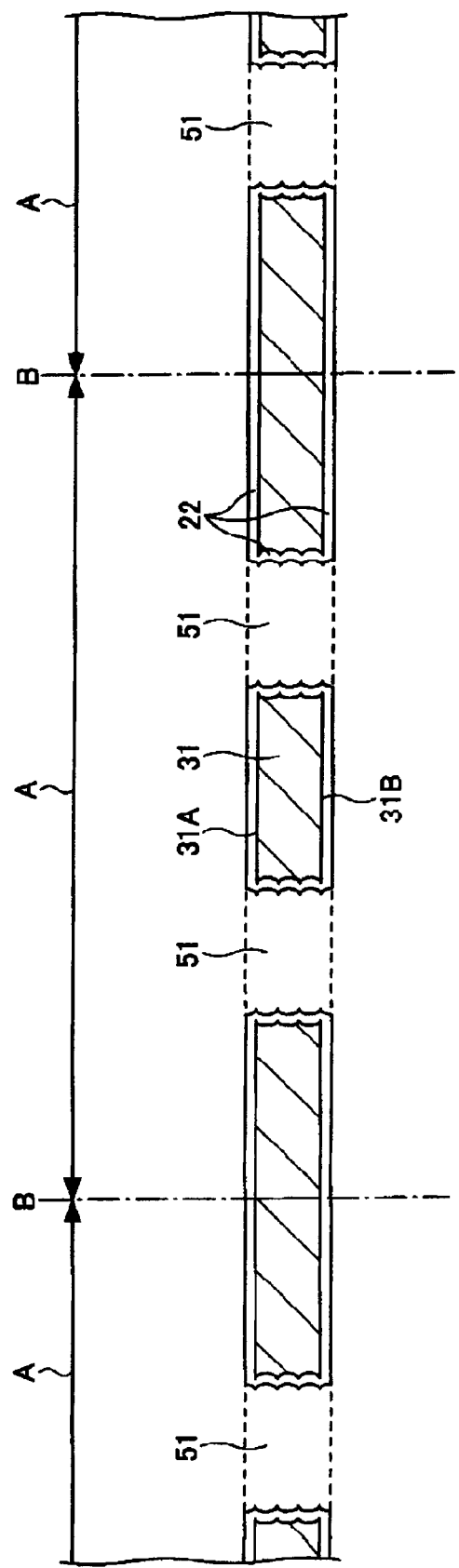
FIG. 27 is a view (#3) illustrating a step of manufacturing the substrate according to the second embodiment of the present invention.

In a step illustrated in FIG. 27, the insulating film 22 is formed to cover the both surfaces 31A and 31B of the silicon substrate 31 and the surface of the silicon substrate 31 corresponding to the side surface of the through hole 51 (insulating film forming step). For example, an oxide film, a thermal oxide film, a nitride film (for example, SiN film), which is formed by a CVD method, may be used as the insulating film 22. When the oxide film or the thermal oxide film is used as the insulating film 22, the thickness of the insulating film 22 may be in the range of, for example, 0.5 to 1.5 μm.

Figure 28:
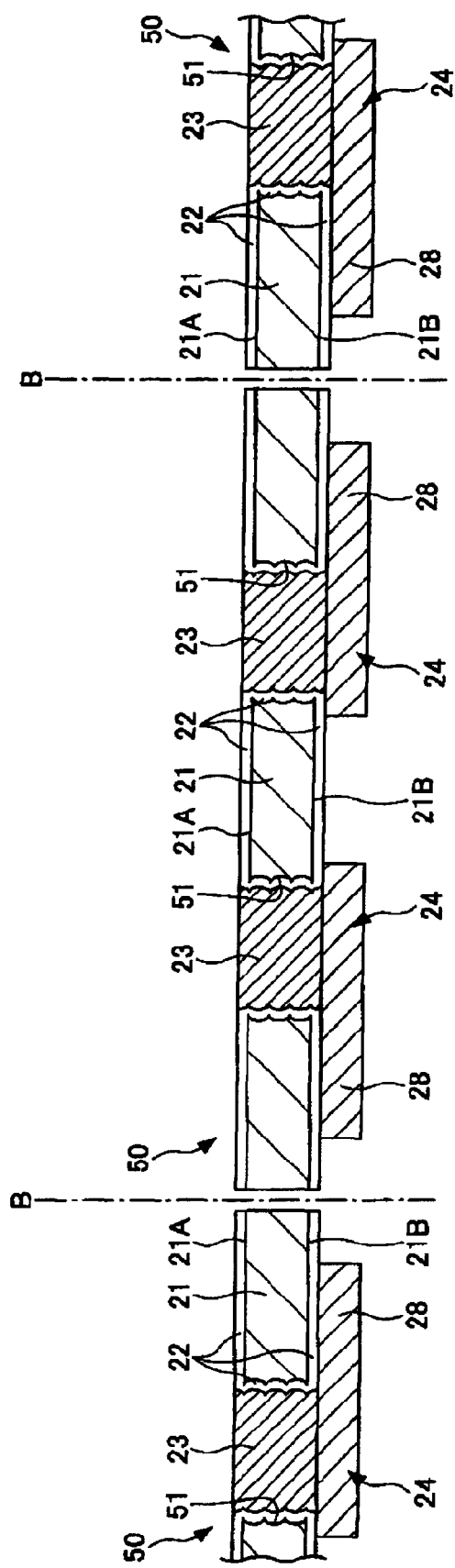
FIG. 28 is a view (#4) illustrating a step of manufacturing the substrate according to the second embodiment of the present invention.

After that, the same steps as the steps of FIGS. 21 to 23 described in the first embodiment are performed in a step illustrated in FIG. 28. As a result, a plurality of substrates 50 is manufactured.

In the method of manufacturing a substrate according to this embodiment, the silicon substrate 31 is etched by the Bosch process in order to form the through hole 51; and the acicular protrusions 34 made of silicon, the abrasive grains 37, and the polishing chips 38, which are formed on the portion of the silicon substrate 31 corresponding to the through hole 51, are removed by performing wet etching on the portion of the silicon substrate 31 corresponding to at least the side surface of the through hole 51. Therefore, it is possible to form the insulating film 22 without defects on the surface of the silicon substrate 31 corresponding to the side surface of the through hole 51. Accordingly, it is possible to sufficiently ensure an insulating property between the silicon substrate 31 and the through electrode 23 formed on the through hole 51, by the insulating film 22 that is formed on the portion of the silicon substrate 31 corresponding to the side surface of the through hole 51.

The unevenness of the portion having a scalloping shape is reduced by performing wet etching on the portion of the silicon substrate 31 corresponding to the side surface of the through hole 51 that is formed in the scalloping shape. For this reason, since a convex portion has a round shape, it is possible to suppress the formation of the defects on the insulating film 22 that is formed on the side surface of the through hole 51.

Third Embodiment

FIGS. 29 to 40 are views illustrating steps of manufacturing the substrate according to the third embodiment of the present invention. In FIGS. 29 to 40, the same components as those described in the steps of manufacturing the substrate according to the first embodiment are represented by the same reference numerals, and their description will be omitted hereinafter.

The steps of manufacturing the substrate in the third embodiment are different from those in the first embodiment in terms of formation step of the through hole. Specifically, the third embodiment is different from the first embodiment in that a hole 60 is formed in the silicon substrate 31 from the upper surface 31A of the silicon substrate 31, and then the silicon substrate 31 are ground from the lower surface 31B of the silicon substrate 31, so that the through hole is formed. Hereinafter, the steps of manufacturing the substrate in the third embodiment will be described with reference to FIGS. 29 to 40.

Figure 29:
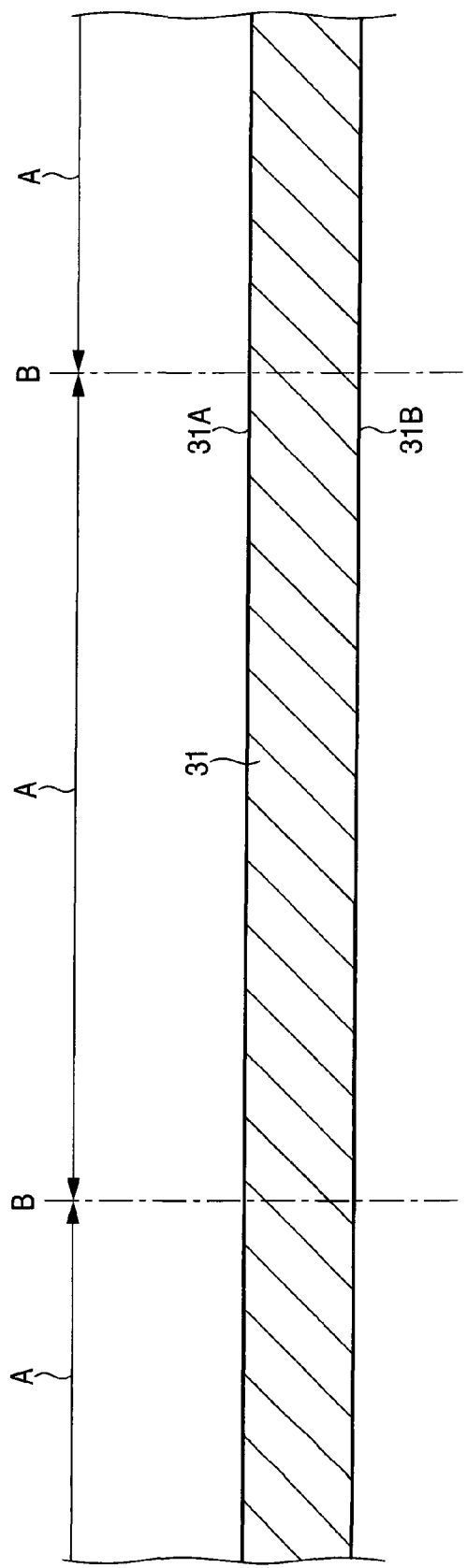
FIG. 29 is a view (#1) illustrating a step of manufacturing the substrate according to a third embodiment of the present invention.
Figure 30:
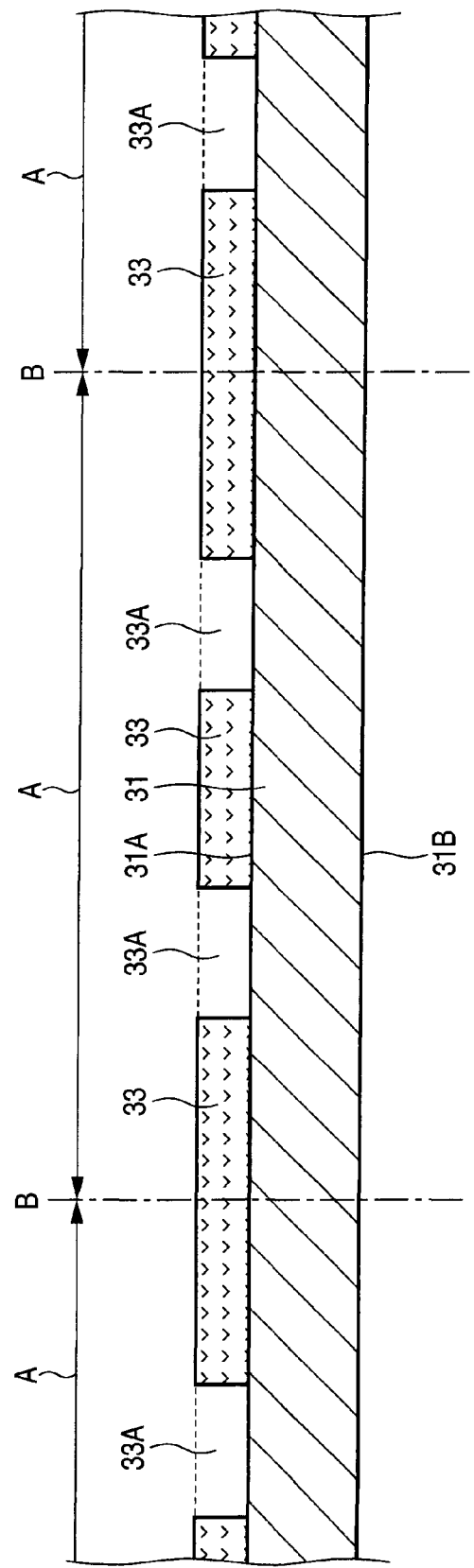
FIG. 30 is a view (#2) illustrating a step of manufacturing the substrate according to the third embodiment of the present invention.

In a step illustrated in FIG. 29, the silicon substrate 31 is prepared which has the plurality of substrate forming regions A where the substrates 10 are formed. The different point from the first embodiment is that the protective tape 32 is not attached to the lower surface 31B of the silicon substrate 31. Subsequently, a step illustrated in FIG. 30 is the same as the step illustrated in FIG. 13 in the first embodiment, and its description will be omitted here.

Figure 31:
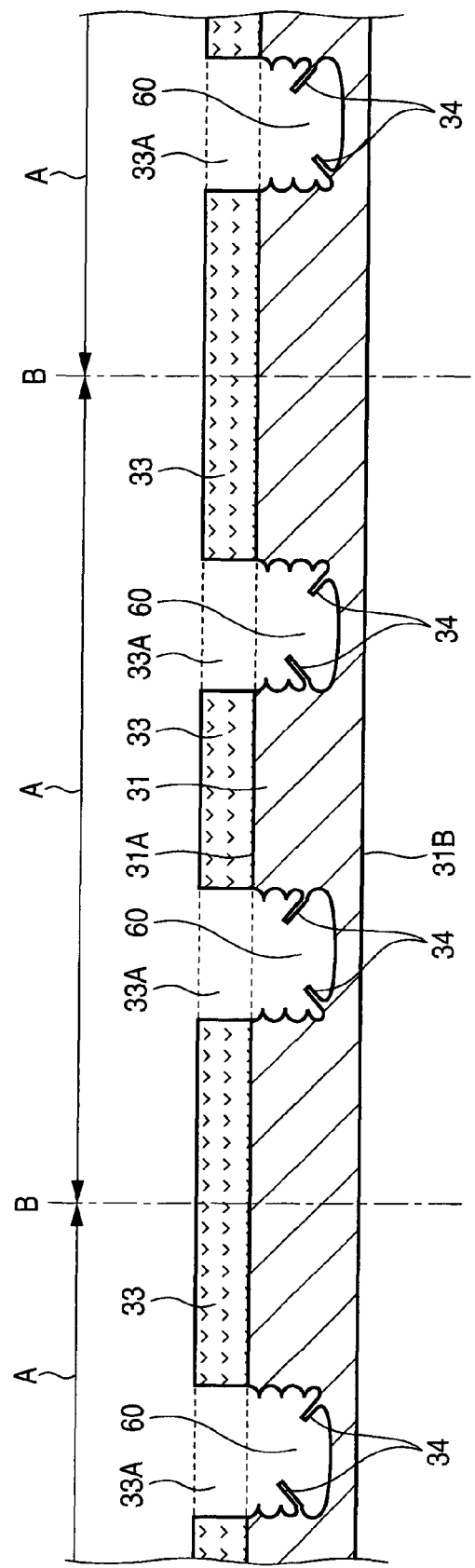
FIG. 31 is a view (#3) illustrating a step of manufacturing the substrate according to the third embodiment of the present invention.

In a step illustrated in FIG. 31, the portion of the silicon substrate 31, which is exposed to the outside through the opening 33A of the resist film 33, is etched by the Bosch process (the silicon substrate 31 is etched from the upper surface 31A), so that the hole 60 is formed. In this case, the portion of the silicon substrate 31, which corresponds to the side surface of the hole 60, is formed into a scalloping shape. Further, acicular protrusions 34 made of silicon are formed on the portion of the silicon substrate 31 that corresponds to the side surface of the hole 60. In this step, the depth of the hole 60 may be about two-thirds as much as the thickness of the silicon substrate 31, for example.

Figure 32:
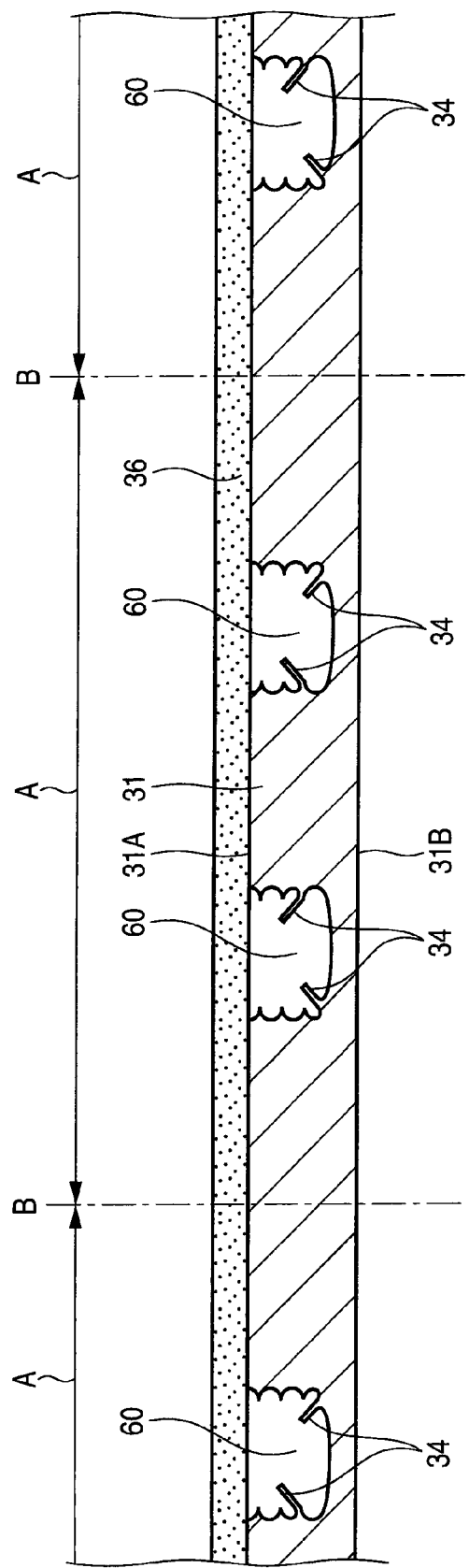
FIG. 32 is a view (#4) illustrating a step of manufacturing the substrate according to the third embodiment of the present invention.

In a step illustrated in FIG. 32, the resist film 33 shown in FIG. 31 are removed and the back-grinding tape 36 is then attached to the upper surface 31A of the silicon substrate 31.

Figure 33:
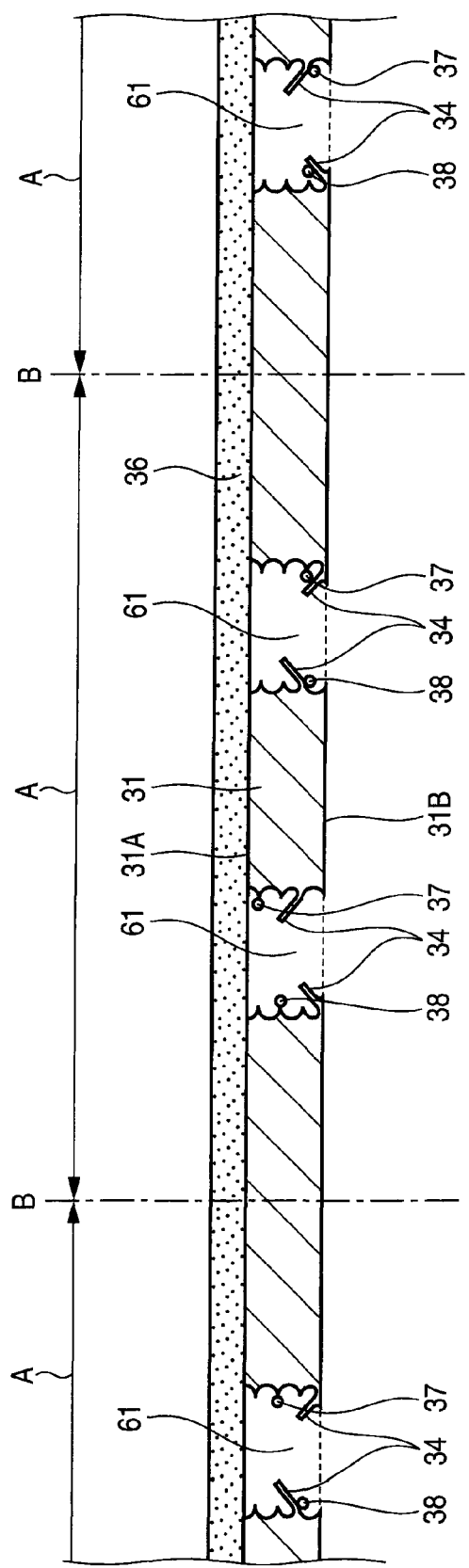
FIG. 33 is a view (#5) illustrating a step of manufacturing the substrate according to the third embodiment of the present invention.

In a step illustrated in FIG. 33, the silicon substrate 31 is ground from the lower surface 31B of the silicon substrate 31, so that a through hole 61 passing through the silicon substrate 31 is formed. Thus, the through hole 61 can be formed in the silicon substrate 31 by forming the hole 60 and then grinding the silicon substrate 31 from the lower surface 31B of the silicon substrate 31. Further, when the depth of the hole 60 is about two-thirds as much as the thickness of the silicon substrate 31, the thickness of silicon substrate 31 to be removed is more than a third of the thickness of the silicon substrate 31. Meanwhile, since a polishing solution (slurry) containing abrasive grains 37 is used to polish the silicon substrate 31, the abrasive grains 37 adhere to the surface of the silicon substrate 31 corresponding to the side surface of the through hole 61 as shown in FIG. 16. Further, polishing chips 38, which are generated during the polishing of the silicon substrate 31, also adhere to the surface of the silicon substrate 31 corresponding to the side surface of the through hole 61.

Figure 34:
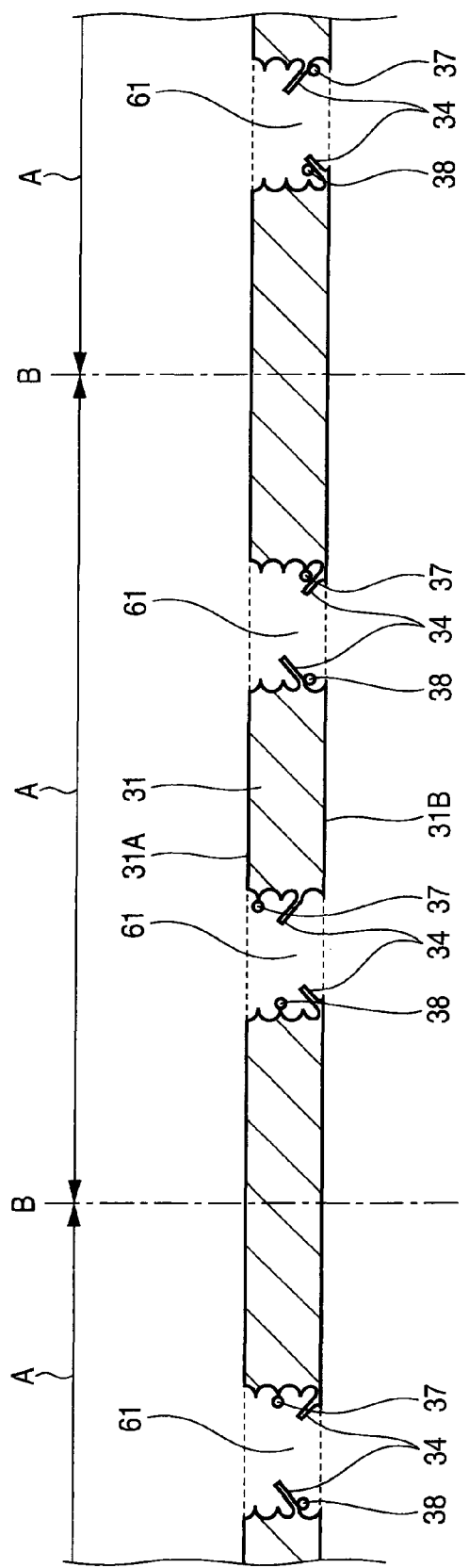
FIG. 34 is a view (#6) illustrating a step of manufacturing the substrate according to the third embodiment of the present invention.
Figure 35:
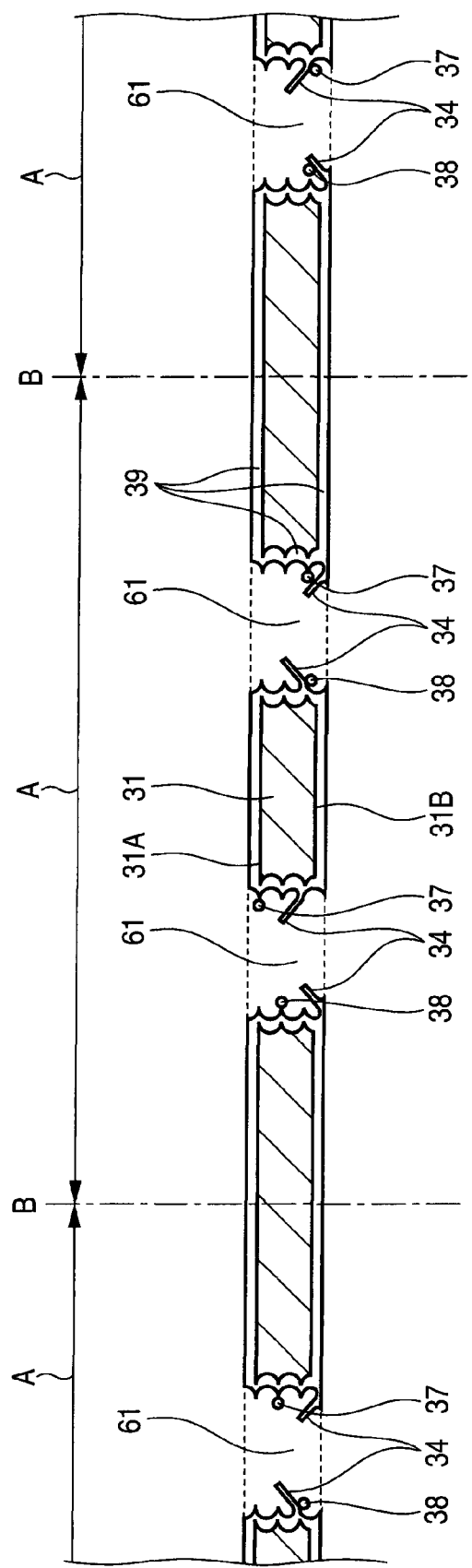
FIG. 35 is a view (#7) illustrating a step of manufacturing the substrate according to the third embodiment of the present invention.
Figure 36:
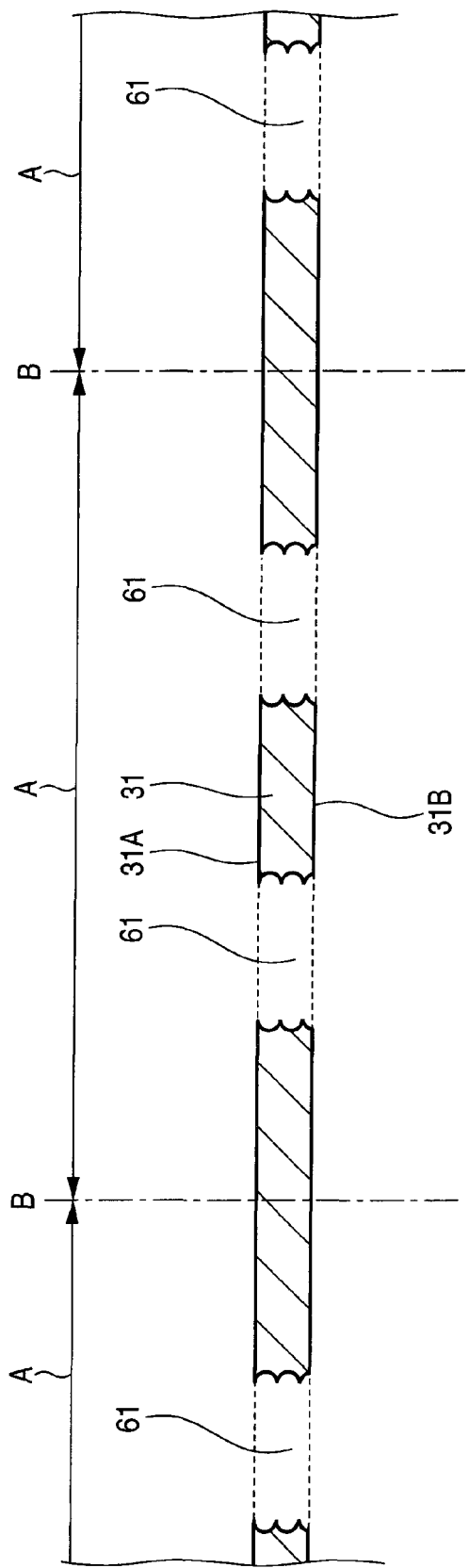
FIG. 36 is a view (#8) illustrating a step of manufacturing the substrate according to the third embodiment of the present invention.
Figure 37:
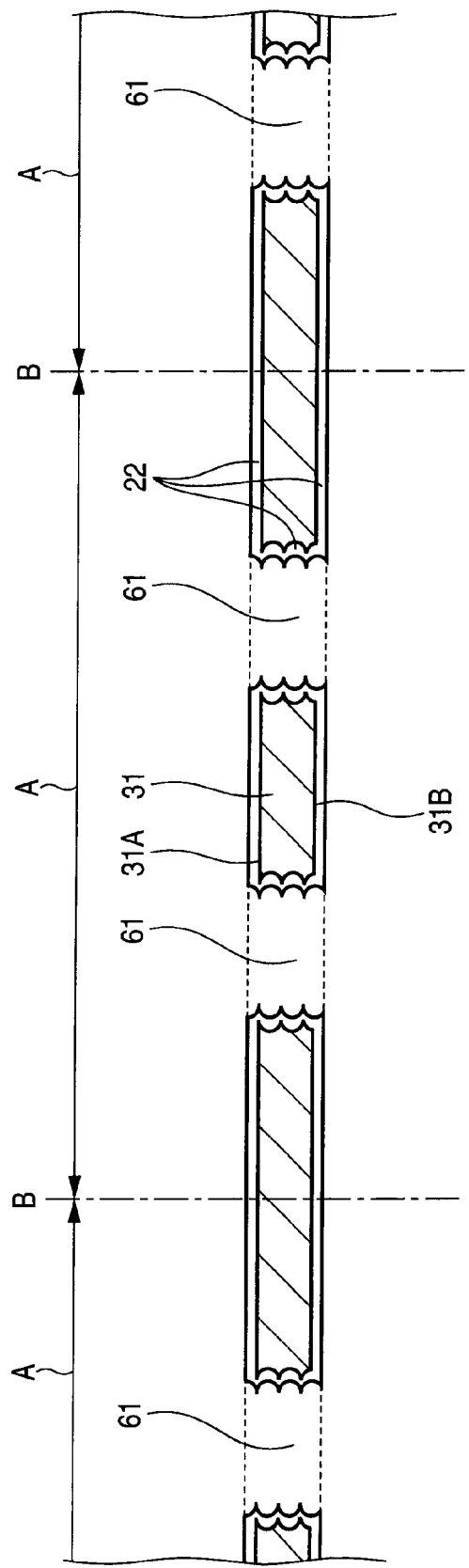
FIG. 37 is a view (#9) illustrating a step of manufacturing the substrate according to the third embodiment of the present invention.
Figure 38:
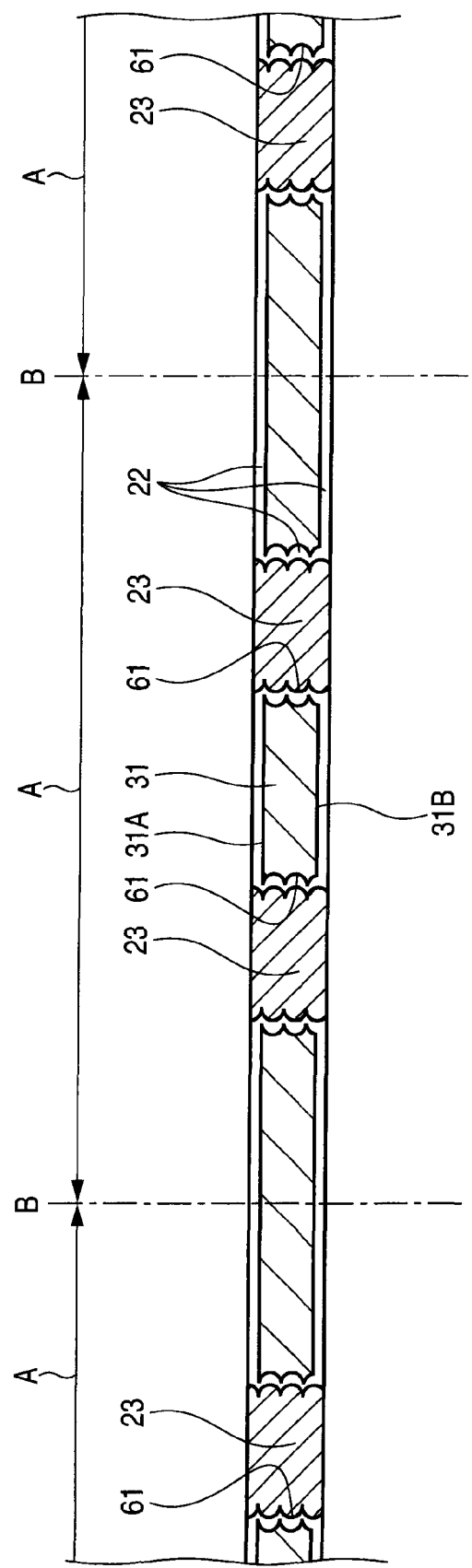
FIG. 38 is a view (#10) illustrating a step of manufacturing the substrate according to the third embodiment of the present invention.
Figure 39:
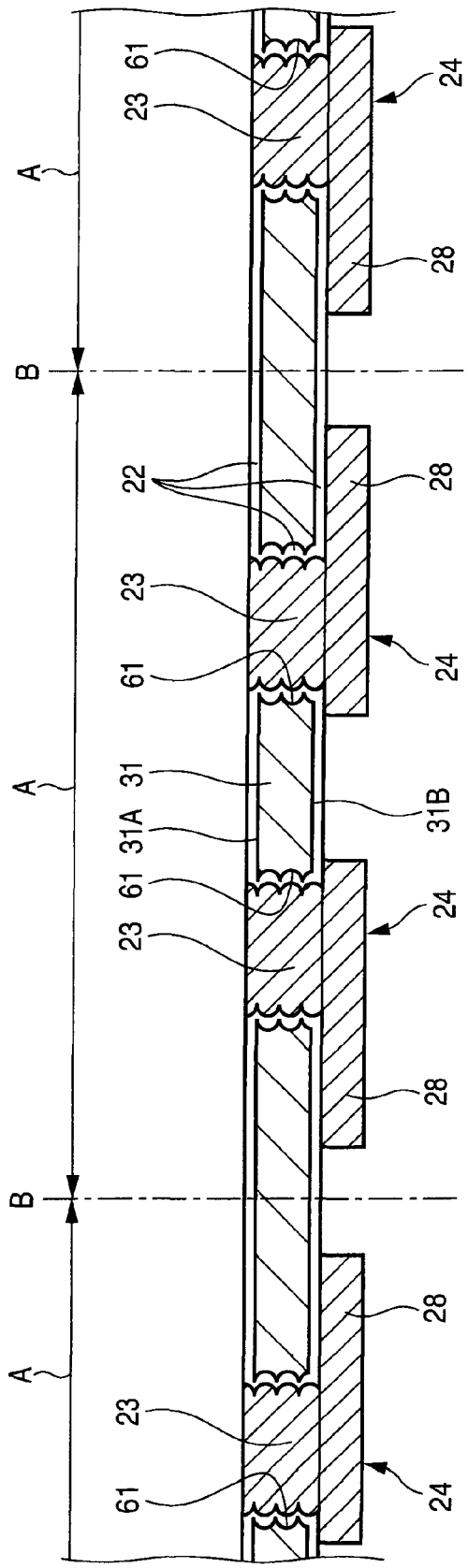
FIG. 39 is a view (#11) illustrating a step of manufacturing the substrate according to the third embodiment of the present invention.
Figure 40:
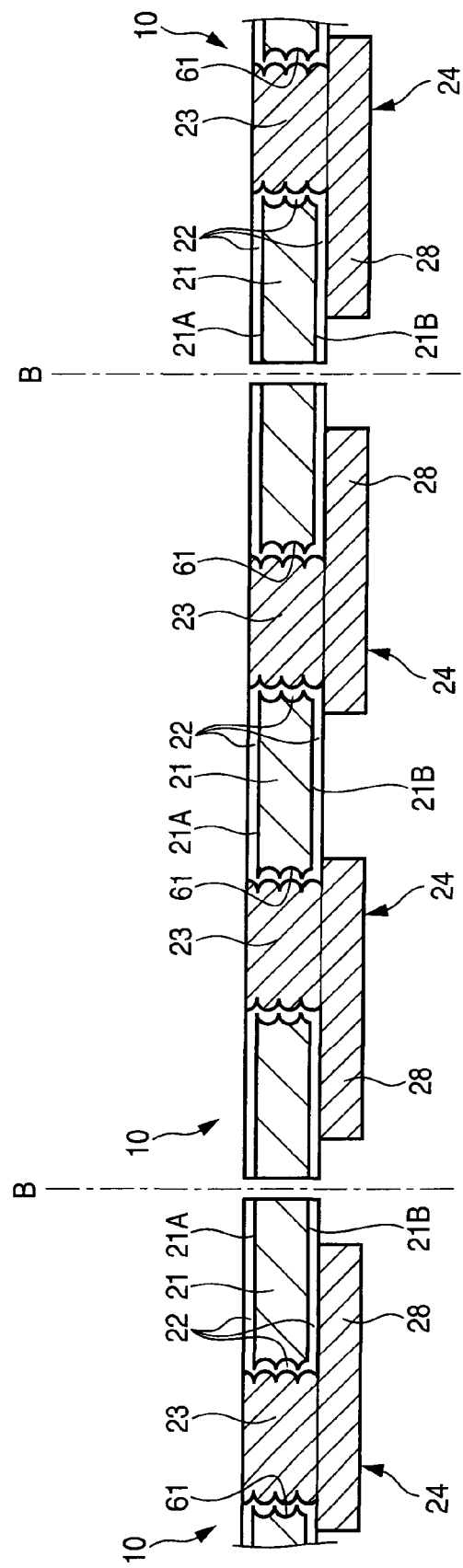
FIG. 40 is a view (#12) illustrating a step of manufacturing the substrate according to the third embodiment of the present invention.
Figure 41:
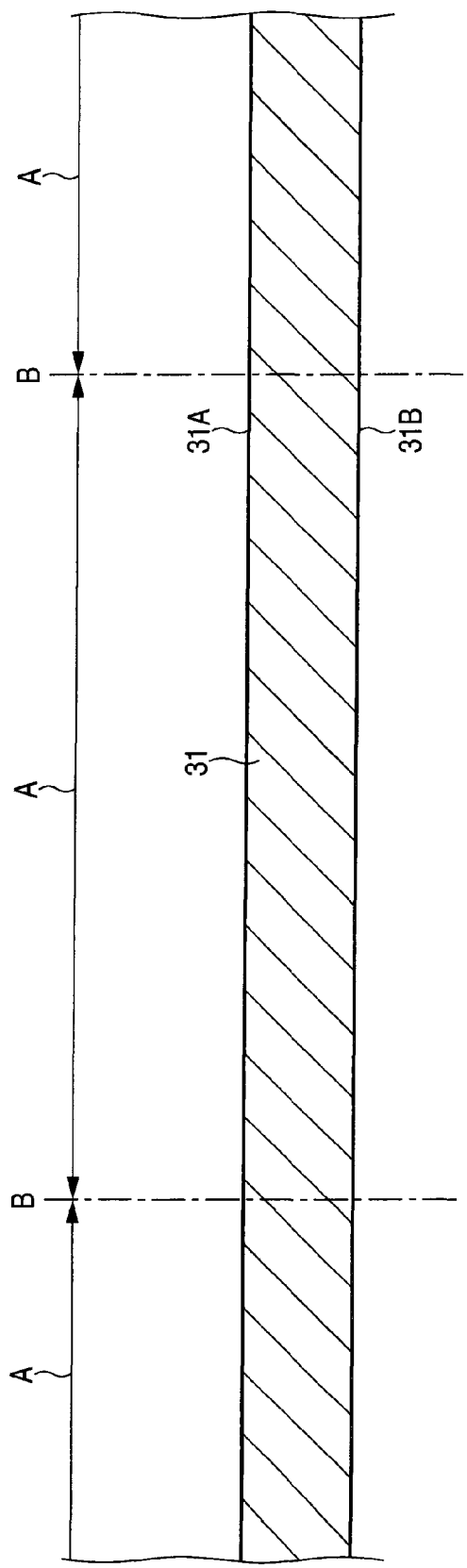
FIG. 41 is a view (#1) illustrating a step of manufacturing the substrate according to a fourth embodiment of the present invention.
Figure 42:
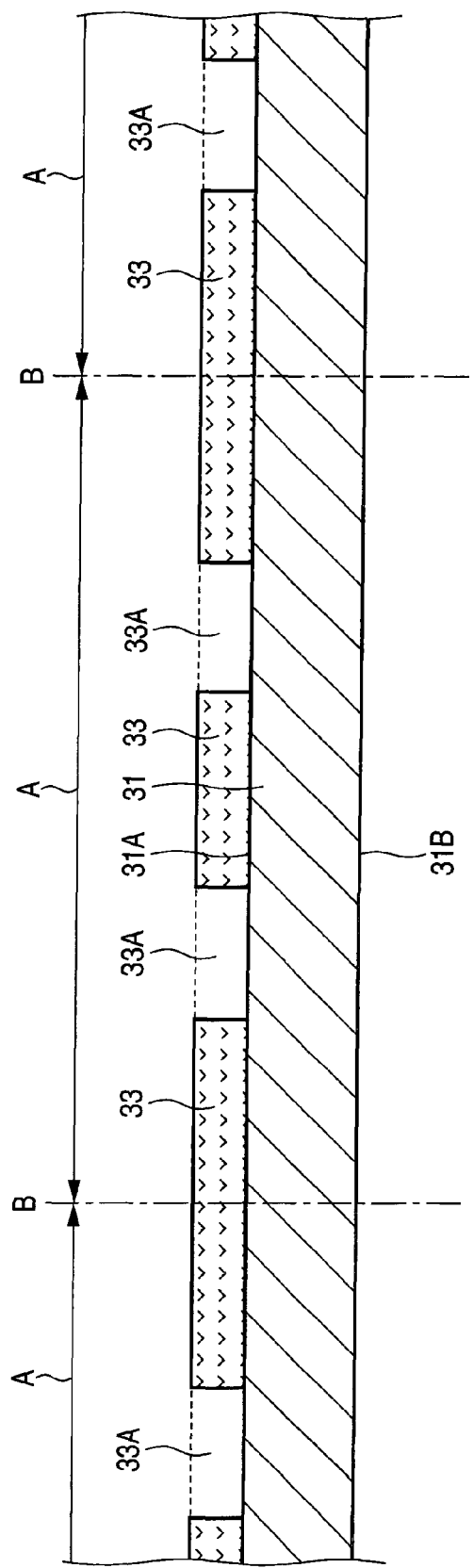
FIG. 42 is a view (#2) illustrating a step of manufacturing the substrate according to the fourth embodiment of the present invention.

In a step illustrated in FIG. 34, the back-grinding tape 36 shown in FIG. 33 is removed. Then, in a step illustrated in FIG. 35, a thermal oxide film 39, which covers the both surfaces 31A and 31B of the silicon substrate 31 and the surface of the silicon substrate 31 corresponding to the side surface of the through hole 61, is formed by thermally oxidizing the structure shown in FIG. 35 (specifically, the silicon substrate 31 having the through hole 61, the acicular protrusions 34, and the abrasive grains 37 and the polishing chips 38 that adhere to the side surface of the through hole 26) (thermal oxide film forming step).

After that, steps illustrated in FIGS. 36 to 40 correspond to those illustrated in FIGS. 19 to 23 in the first embodiment, and their description will be omitted here. Thus, the substrate can be manufactured.

As described above, the third embodiment of the present invention is different from the first embodiment in that the through hole forming step are performed using two steps (i.e., the hole forming step and back-grinding step). Further, in the third embodiment, the wet etching step illustrated in FIG. 26 in the second embodiment can be employed instead of the thermal oxide film forming step illustrated in FIG. 35.

Fourth Embodiment

FIGS. 41 to 46 are views illustrating steps of manufacturing the substrate according to the fourth embodiment of the present invention. In FIGS. 41 to 46, the same components as those described in the steps of manufacturing the substrate according to the third embodiment (FIGS. 29 to 40) are represented by the same reference numerals, and their description will be omitted hereinafter.

The steps of manufacturing the substrate in the fourth embodiment are the same as those in the third embodiment in that the hole 60 is formed in the silicon substrate 31 from the upper surface 31A of the silicon substrate 31 and then the silicon substrate 31 is ground from the lower surface 31B of the silicon substrate 31. Meanwhile, this embodiment is different from the third embodiment in that the thermal oxide film forming step is performed before the back-grinding step. Specifically, in the third embodiment, after the hole 60 is formed in the silicon substrate 31, the silicon substrate 31 is ground from the lower surface 31B of the silicon substrate 31, so that the through hole 61 can be formed in the silicon substrate 31. After that, the thermal oxide film 39 is formed to cover the silicon substrate 31. Meanwhile, in the fourth embodiment, after the hole 60 is formed in the silicon substrate 31, the thermal oxide film 39 is formed to cover the silicon substrate 31, and then the silicon substrate 31 is ground from the lower surface 31B of the silicon substrate 31. Thus, the through hole 61 can be formed in the silicon substrate 31.

Figure 43:
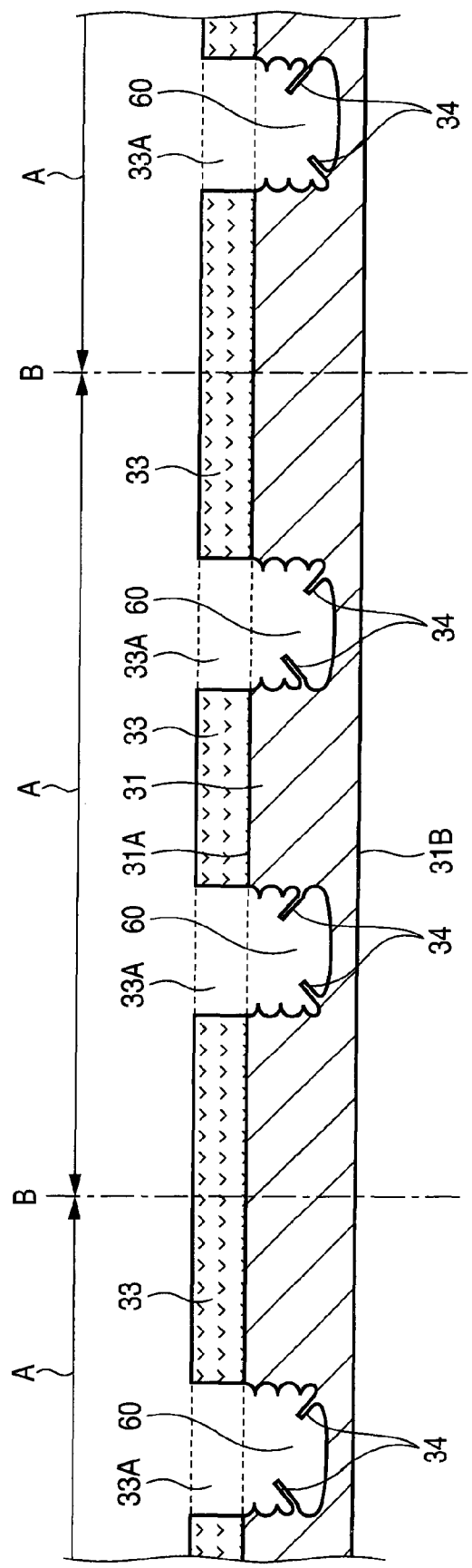
FIG. 43 is a view (#3) illustrating a step of manufacturing the substrate according to the fourth embodiment of the present invention.
Figure 44:
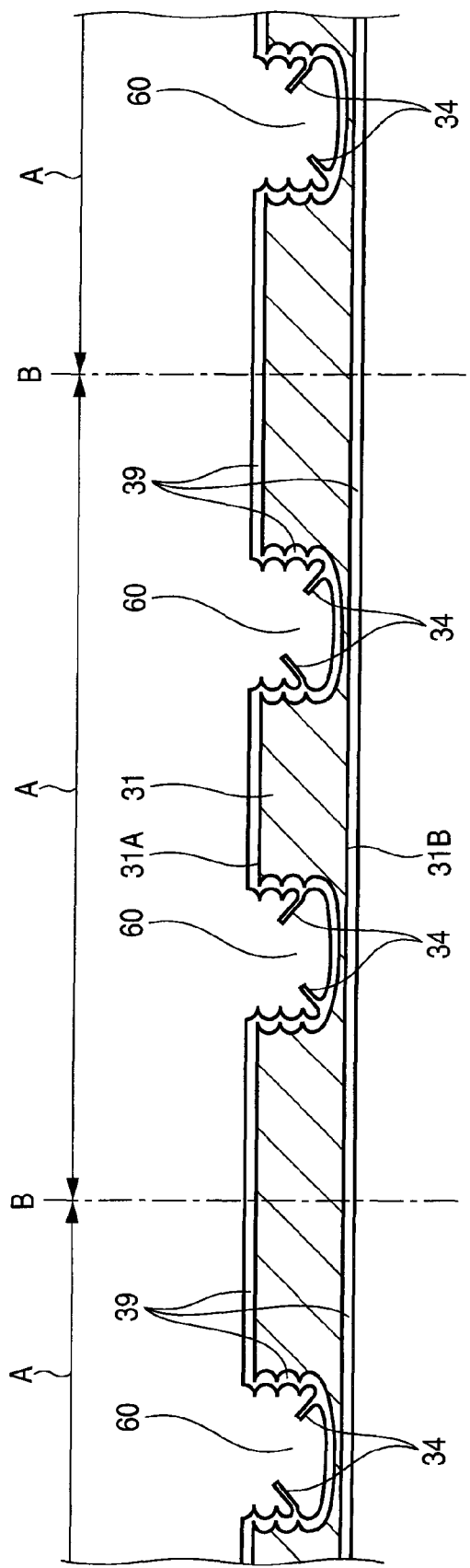
FIG. 44 is a view (#4) illustrating a step of manufacturing the substrate according to the fourth embodiment of the present invention.

Hereinafter, the steps of manufacturing the substrate in the fourth embodiment will be described with reference to FIGS. 41 to 46. The steps illustrated in FIGS. 41 to 43 correspond to those illustrated in FIGS. 29 to 31, and thus their description will be omitted herein. In a step illustrated in FIG. 44, the resist film 33 shown in FIG. 43 is removed and then the structure shown in FIG. 43 (i.e., the silicon substrate 31 having the hole 60 and the acicular protrusions 34) are thermally oxidized. Thus, the thermal oxide film 39, which covers the both surfaces 31A and 31B of the silicon substrate 31 and the surfaces of the silicon substrate 31 corresponding to the side surface and bottom surface of the hole 60, is formed (thermal oxide film forming step).

Figure 45:
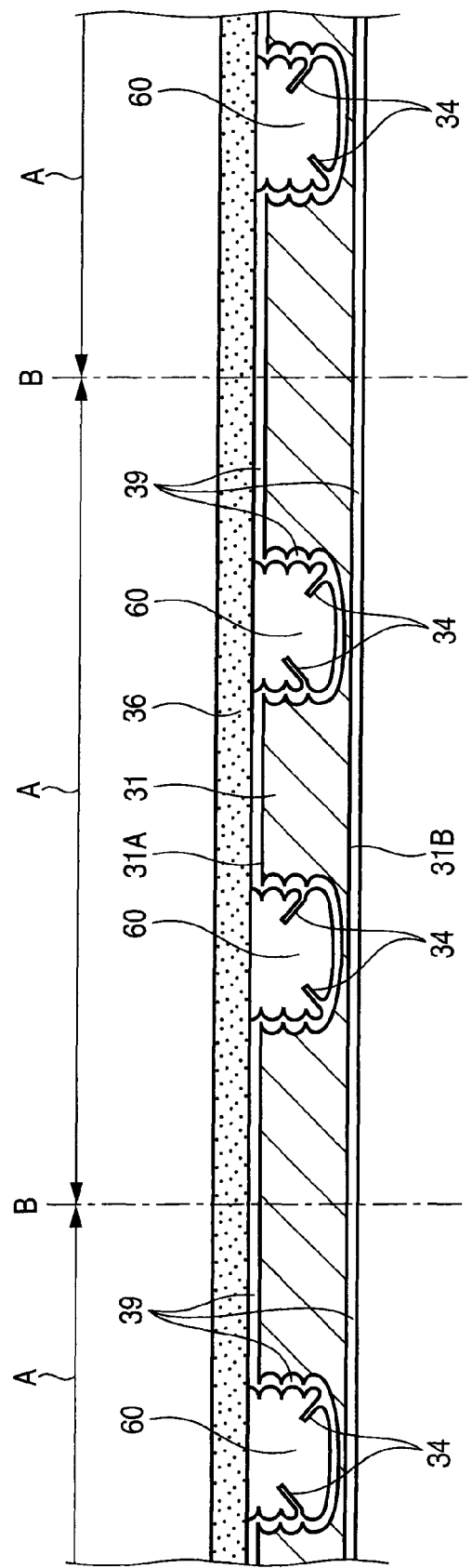
FIG. 45 is a view (#5) illustrating a step of manufacturing the substrate according to the fourth embodiment of the present invention.

In a step illustrated in FIG. 45, the back-grinding tape 36 is attached to the upper surface 31A of the silicon substrate 31.

Figure 46:
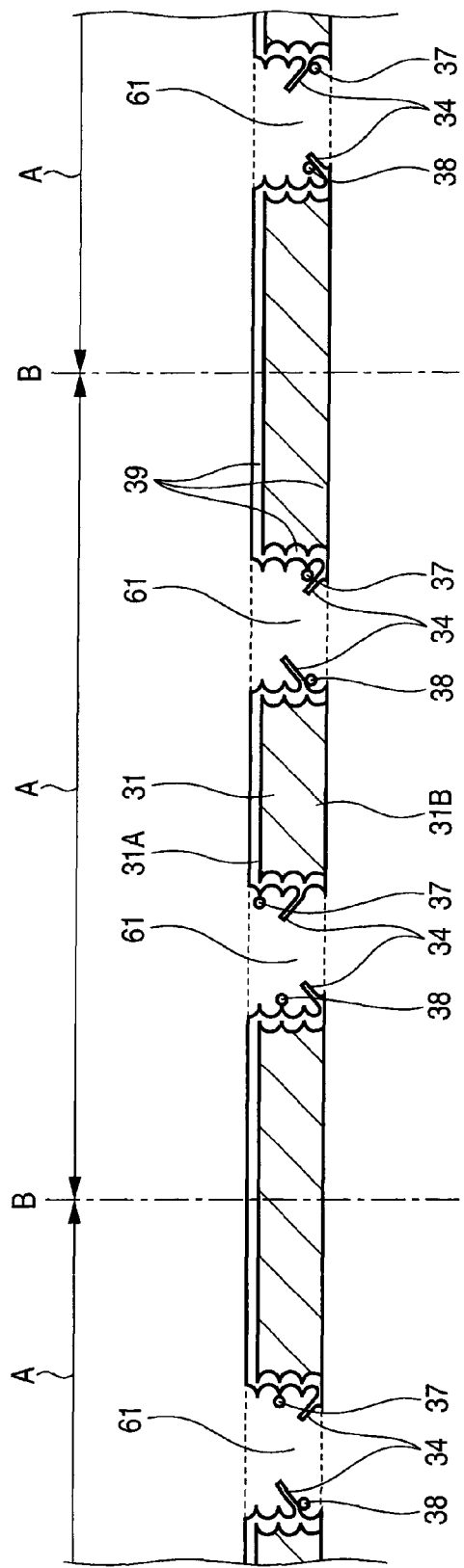
FIG. 46 is a view (#6) illustrating a step of manufacturing the substrate according to the fourth embodiment of the present invention.

In a step illustrated in FIG. 46, the silicon substrate 31 is ground from the lower surface 31B of the silicon substrate 31, so that the through hole 61 can be manufactured. Thus, the through hole 61 can be manufactured by forming the hole 60 in the silicon substrate 31 and grinding the silicon substrate 31 from the lower surface 31B of the silicon substrate 31.

After that, the substrate can be manufactured by performing the steps illustrated in FIGS. 36 to 40.

As described above, the fourth embodiment is different from the third embodiment in that the hole 60 is formed in the silicon substrate 31, then thermal oxide film 39 is formed to cover the silicon substrate 31, and then the silicon substrate 31 is ground from the lower surface 31B of the silicon substrate 31, so that the through hole 61 can be formed. Further, in the fourth embodiment, since the back-grinding step is performed after the thermal oxide film forming step, the abrasive grains 37 and the polishing chips 38 adhering to the portion of the silicon substrate 31 corresponding to the side surface of the through hole 61 can be effectively removed in the following thermal oxide film removing step.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A method of manufacturing a substrate that includes a silicon substrate, a through hole formed in the silicon substrate, and a through electrode formed in the through hole and being insulated from the silicon substrate, the method comprising:
   (a) forming the through hole by etching the silicon substrate from a first surface of the silicon substrate by a Bosch process;
   (b) forming a thermal oxide film such that the thermal oxide film covers the first surface of the silicon substrate, a second surface of the silicon substrate opposite to the first surface, and a surface of the silicon substrate corresponding to a side surface of the through hole, by thermally oxidizing the silicon substrate where the through hole is formed;
   (c) removing the thermal oxide film;
   (d) forming an insulating film such that the insulating film covers the first and second surfaces of the silicon substrate and the surface of the silicon substrate corresponding to the side surface of the through hole; and
   (e) forming the through electrode in the through hole on which the insulating film is formed.

2. The method according to claim 1, further comprising:
   (f) removing a notch by grinding a portion of the silicon substrate where the notch is formed, from the second surface side, if the notch is formed at the end of the through hole positioned on the second surface side of the silicon substrate in step (a).

3. The method according to claim 2, wherein step (f) is performed before step (b).

4. The method according to claim 2, wherein step (f) is performed after step (b).

5. The method according to claim 1, wherein the thermal oxide film is removed by wet etching in step (c).

6. The method according to claim 1, further comprising:
   (g) forming a wiring connected to the through electrode, on the insulating film formed on the second surface of the silicon substrate.

7. A method of manufacturing a substrate that includes a silicon substrate, a through hole formed in the silicon substrate, and a through electrode formed in the through hole and being insulated from the silicon substrate, the method comprising:
   (a) forming a hole by etching the silicon substrate from a first surface of the silicon substrate by a Bosch process;
   (b) grinding the silicon substrate from a second surface of the silicon substrate opposite to the first surface such that the hole is the through hole passing through the silicon substrate;
   (c) forming a thermal oxide film such that the thermal oxide film covers the first surface of the silicon substrate, the second surface of the silicon substrate and a surface of the silicon substrate corresponding to a side surface of the through hole, by thermally oxidizing the silicon substrate where the through hole is formed;
   (d) removing the thermal oxide film;
   (e) forming an insulating film such that the insulating film covers the first and second surfaces of the silicon substrate and the surface of the silicon substrate corresponding to the side surface of the through hole; and
   (f) forming the through electrode in the through hole on which the insulating film is formed.

8. A method of manufacturing a substrate that includes a silicon substrate, a through hole formed in the silicon substrate, and a through electrode formed in the through hole and being insulated from the silicon substrate, the method comprising:

(a) forming a hole by etching the silicon substrate from a first surface of the silicon substrate by a Bosch process;
(b) forming a thermal oxide film such that the thermal oxide film covers the first surface of the silicon substrate, a second surface of the silicon substrate opposite to the first surface, and surfaces of the silicon substrate corresponding to a side surface and a bottom surface of the hole, by thermally oxidizing the silicon substrate where the hole is formed;
(c) grinding the silicon substrate from the second surface such that the hole is the through hole passing through the silicon substrate;
(d) removing the thermal oxide film;
(e) forming an insulating film such that the insulating film covers the first and second surfaces of the silicon substrate and a surface of the silicon substrate corresponding to a side surface of the through hole; and
(f) forming the through electrode in the through hole on which the insulating film is formed.

9. The method according to claim 7, wherein the thermal oxide film is removed by wet etching in step (d).

10. The method according to claim 7, further comprising:
(g) forming a wiring connected to the through electrode, on the insulating film formed on the second surface of the silicon substrate.

11. The method according to claim 8, wherein the thermal oxide film is removed by wet etching in step (d).

12. The method according to claim 8, further comprising:
(g) forming a wiring connected to the through electrode, on the insulating film formed on the second surface of the silicon substrate.

* * * * *